(12) United States Patent
Paik et al.

(10) Patent No.: US 11,074,382 B2
(45) Date of Patent: Jul. 27, 2021

(54) QUANTUM COMPUTING DEVICE DESIGN

(71) Applicant: International Business Machines Corporation, Armonk, NY (US)

(72) Inventors: Hanhee Paik, Danbury, CT (US); Firat Solgun, Ossining, NY (US); Salvatore Bernardo Olivadese, Stamford, CT (US); Martin O. Sandberg, Ossining, NY (US); Jay M. Gambetta, Yorktown Heights, NY (US)

(73) Assignee: INTERNATIONAL BUSINESS MACHINES CORPORATION, Armonk, NY (US)

( * ) Notice: Subject to any disclaimer, the term of this patent is extended or adjusted under 35 U.S.C. 154(b) by 618 days.

(21) Appl. No.: 15/883,652

(22) Filed: Jan. 30, 2018

(65) Prior Publication Data
US 2019/0236218 A1    Aug. 1, 2019

(51) Int. Cl.
*G06N 10/00* (2019.01)
*G06F 30/3323* (2020.01)
*G06F 30/367* (2020.01)
*G06N 7/04* (2006.01)

(52) U.S. Cl.
CPC ........ *G06F 30/3323* (2020.01); *G06F 30/367* (2020.01); *G06N 10/00* (2019.01); *G06N 7/04* (2013.01)

(58) Field of Classification Search
CPC .... G06F 30/3323; G06F 30/367; G06N 10/00
USPC ................................. 703/2, 5, 13
See application file for complete search history.

(56) References Cited

U.S. PATENT DOCUMENTS

| 8,513,647 | B1 | 8/2013 | Bacon et al. | |
| 8,539,400 | B2 * | 9/2013 | Alpert | G06F 30/327 |
| | | | | 716/104 |
| 9,170,278 | B2 | 10/2015 | Neufeld | |
| 9,826,699 | B1 * | 11/2017 | Bergemann | C12N 15/8274 |
| 10,068,181 | B1 * | 9/2018 | Rigetti | H01L 39/045 |
| 10,127,499 | B1 * | 11/2018 | Rigetti | G06F 15/16 |
| 10,140,404 | B2 * | 11/2018 | Rigetti | G06F 30/367 |
| 10,695,167 | B2 * | 6/2020 | Van Heugten | A61F 2/1624 |

(Continued)

FOREIGN PATENT DOCUMENTS

WO    2017/078731 A1    5/2017

OTHER PUBLICATIONS

Nigg, et al., "Black-box superconducting circuit quantization," arXiv:1204.0587v1 [cond-mat.mes-hall] Apr. 3, 2012, 10 pages.

(Continued)

*Primary Examiner* — Thai Q Phan
(74) *Attorney, Agent, or Firm* — Amin, Turocy & Watson, LLP

(57) ABSTRACT

Techniques and a system for quantum computing device modeling and design are provided. In one example, a system includes a modeling component and a simulation component. The modeling component models a quantum device element of a quantum computing device as an electromagnetic circuit element to generate electromagnetic circuit data for the quantum computing device. The simulation component simulates the quantum computing device using the electromagnetic circuit data to generate response function data indicative of a response function for the quantum computing device. Additionally or alternatively, a Hamiltonian is constructed based on the response function.

25 Claims, 13 Drawing Sheets

(56) References Cited

U.S. PATENT DOCUMENTS

| | | | |
|---|---|---|---|
| 2006/0123363 A1 | 6/2006 | Williams et al. | |
| 2007/0280319 A1* | 12/2007 | Sekiguchi | H01S 5/3402 |
| | | | 372/45.01 |
| 2008/0163142 A1* | 7/2008 | White | G06F 30/398 |
| | | | 716/52 |
| 2011/0270593 A1 | 11/2011 | Meuris et al. | |
| 2012/0043932 A1* | 2/2012 | Nakama | H02J 50/10 |
| | | | 320/108 |
| 2012/0212375 A1* | 8/2012 | Depree, IV | H01Q 15/0086 |
| | | | 343/700 MS |
| 2014/0336479 A1* | 11/2014 | Ando | A61B 5/14551 |
| | | | 600/310 |
| 2016/0162617 A1* | 6/2016 | Fontes | G06F 30/23 |
| | | | 703/1 |
| 2016/0335381 A1 | 11/2016 | Liu et al. | |
| 2017/0049407 A1* | 2/2017 | Ando | A61B 5/055 |
| 2017/0228483 A1* | 8/2017 | Rigetti | G06N 10/00 |
| 2018/0232652 A1* | 8/2018 | Curtis | G06N 10/00 |
| 2018/0240035 A1* | 8/2018 | Scheer | G01R 33/0358 |
| 2018/0365587 A1* | 12/2018 | Barzegar | G06N 10/00 |
| 2019/0138675 A1* | 5/2019 | Fontes | G06F 30/23 |

OTHER PUBLICATIONS

Solgun, et al., "Blackbox Quantization of Superconducting Circuits using exact Impedance Synthesis," arXiv:1403.7341v1 [quant-ph] Mar. 28, 2014, 16 pages.

Solgun, et al., "Multiport Impedance Quantization," arXiv:1505.04116v1 [quant-ph] May 15, 2015, 72 pages.

Svore, et al., "Toward a Software Architecture for Quantum Computing Design Tools," Last Accessed: Dec. 11, 2017, 20 pages.

Sinha, et al., "Quantum computing algorithm for electromagnetic field simulation," Received: Apr. 29, 2009, Quantum Inf Process (2010), 2 pages.

International Search Report and Written Opinion received for PCT Application Serial No. PCT/EP2019/050608 dated May 7, 2019, 14 pages.

Solgun, Firat, "Analysis and Synthesis of Multi-Qubit, Multi-Mode Quantum Devices", URL: http://publications.rwth-aachen.de/record/465229/files/465229.pdf, Mar. 27, 2015, 181 pages.

* cited by examiner

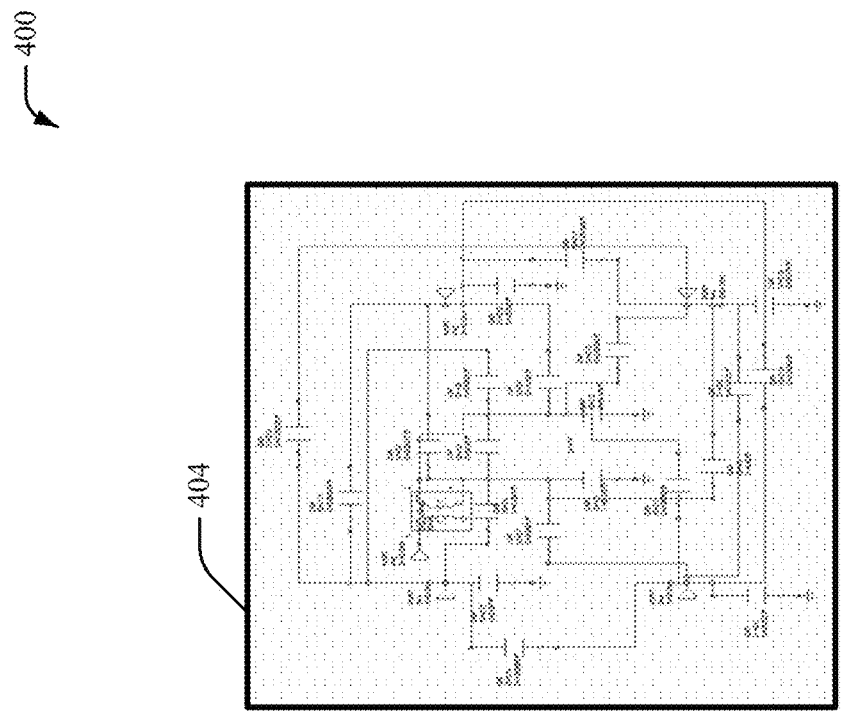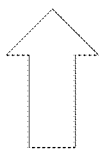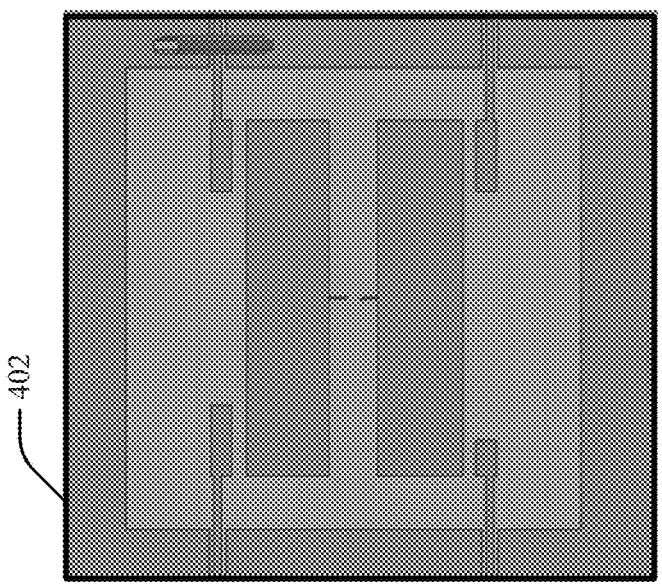
FIG. 4

QUANTUM COMPUTING DEVICE DESIGN

BACKGROUND

The subject disclosure relates to quantum computing devices, and more specifically, to quantum computing device design. Quantum computing employs quantum physics to encode information rather than binary digital techniques based on transistors. For example, a quantum computing device can employ quantum bits (e.g., qubits) that operate according to a superposition principle of quantum physics and an entanglement principle of quantum physics. The superposition principle of quantum physics allows each qubit to represent both a value of "1" and a value of "0" at the same time. The entanglement principle of quantum physics states allows qubits in a superposition to be correlated with each other. For instance, a state of a first value (e.g., a value of "1" or a value of "0") can depend on a state of a second value. As such, a quantum computing device can employ qubits to encode information rather than binary digital techniques based on transistors. However, design of a quantum computing device is generally difficult and/or time consuming as compared to conventional binary digital devices. For instance, Svore, et al., "Toward a Software Architecture for Quantum Computing Design Tools," discloses "a computer-aided design flow that transforms a high-level language program representing a quantum computing algorithm into a technology-specific implementation." Svore et al. also discloses "the design flow (FIG. 1) is a four-phase process that maps a high-level program representing a quantum algorithm into a technology-specific implementation or simulation." Further, Svore et al. states "the first three phases of the design flow are part of the quantum computer compiler (QCC) . . . [t]he last phase is a simulation or an implementation of the quantum algorithm on a quantum device." As such, a design process for a quantum computing device and/or a design of quantum computing device can be improved.

SUMMARY

The following presents a summary to provide a basic understanding of one or more embodiments of the invention. This summary is not intended to identify key or critical elements, or delineate any scope of the particular embodiments or any scope of the claims. Its sole purpose is to present concepts in a simplified form as a prelude to the more detailed description that is presented later. In one or more embodiments described herein, devices, systems, computer-implemented methods, apparatus and/or computer program products for facilitating quantum computing device design are described.

According to an embodiment, a system of a quantum computing device design tool can comprise a modeling component and a simulation component. The modeling component can model a quantum device element of a quantum computing device as an electromagnetic circuit element to generate electromagnetic circuit data for the quantum computing device. The simulation component can simulate the quantum computing device using the electromagnetic circuit data to generate response function data indicative of a response function for the quantum computing device. In an embodiment, the system can minimize an amount of time to design the quantum computing device and/or can reduce an amount of computational resources employed to design the quantum computing device. In certain embodiments, the quantum device element can be a first quantum device element of the quantum computing device, and the modeling component can generate connection data indicative of information associated with a connection between the first quantum device element and a second quantum device element of the quantum computing device. In another embodiment, the modeling component can generate the electromagnetic circuit data for the quantum computing device based on the connection data. In certain embodiments, the simulation component can generate the response function data indicative of information associated with the quantum computing device. Additionally, in certain embodiments, the simulation component can also construct a Hamiltonian and/or Hamiltonian data based on the response function data. Additionally or alternatively, the simulation component can re-simulate the quantum computing device using the electromagnetic circuit data in response to a determination that the Hamiltonian data satisfies a defined criterion. Additionally or alternatively, a design component can generate design data indicative of a layout for the quantum computing device based on the Hamiltonian data. In certain embodiments, the modeling component can model the quantum device element of the quantum computing device as the electromagnetic circuit element based on a library of electromagnetic circuit elements. In certain embodiments, the response function data generated by the simulation component can facilitate improved quality of the quantum computing device.

According to another embodiment, a computer-implemented method is provided. The computer-implemented method can comprise modeling, by a system operatively coupled to a processor, a quantum device element of a quantum computing device as an electromagnetic circuit element to generate electromagnetic circuit data for the quantum computing device. The computer-implemented method can also comprise simulating, by the system, the quantum computing device using the electromagnetic circuit data to generate parameter data indicative of a set of parameters for the quantum computing device. In an embodiment, the computer-implemented method can minimize an amount of time to design the quantum computing device and/or can reduce an amount of computational resources employed to design the quantum computing device. The computer-implemented method can also comprise, in certain embodiments, constructing a Hamiltonian, by the system, based on the response function of the quantum computing device simulated. Furthermore, the computer-implemented method can comprise generating, by the system, design data indicative of a layout for the quantum computing device based on the parameter data. In an embodiment, the simulating the quantum computing device can comprise simulating the quantum computing device using the electromagnetic circuit data to generate response function data indicative of a response function for the quantum computing device. In another embodiment, the simulating the quantum computing device can comprise generating the response function data indicative of information associated with the quantum computing device. In another embodiment, the simulating the quantum computing device can comprise constructing a Hamiltonian and/or Hamiltonian data of the quantum computing device based on the response function data. In yet another embodiment, the generating the design data can comprise generating the design data based on the Hamiltonian data. In certain embodiments, the computer-implemented method can further comprise re-simulating, by the system, the quantum computing device using the electromagnetic circuit data in response to a determination that the Hamiltonian data satisfies a defined criterion. In certain embodiments, the computer-implemented method can further comprise generating, by the system, connection data indicative of information associated with one or more connections between quantum device elements of the quantum computing device. In an embodiment, the modeling the quantum device element can comprise generating the electromagnetic circuit data for the quantum computing device based on the connection data. In another embodiment, the modeling the quantum device element can comprise modeling the quantum device element of the quantum computing device as the electromagnetic circuit element based on a library of electromagnetic circuit elements. In yet another embodiment, the generating the design data can comprise improving the quantum computing device.

According to yet another embodiment, a computer program product for quantum computing device design can comprise a computer readable storage medium having program instructions embodied therewith. The program instructions can be executable by a processor and cause the processor to model, by the processor, one or more quantum device elements of a quantum computing device as one or more electromagnetic circuit elements. The program instructions can also cause the processor to generate, by the processor, an equivalent electromagnetic circuit for the quantum computing device based on the one or more electromagnetic circuit elements. Furthermore, the program instructions can cause the processor to simulate, by the processor, the equivalent electromagnetic circuit to generate parameter data indicative of a set of parameters for the quantum computing device. In an embodiment, the computer program product can minimize an amount of time to design the quantum computing device and/or can reduce an amount of computational resources employed to design the quantum computing device. The program instructions can also cause the processor to generate, by the processor, design data indicative of a layout for the quantum computing device based on the parameter data. In certain embodiments, the program instructions can also cause the processor to simulate, by the processor, the equivalent electromagnetic circuit to generate response function data indicative of a response function for the quantum computing device. In certain embodiments, the program instructions can also cause the processor to generate, by the processor, Hamiltonian data based on the response function data, wherein the Hamiltonian data is indicative of information associated with energy of the quantum computing device.

According to yet another embodiment, a system of a quantum computing device design tool can comprise a modeling component, a simulation component and a design component. The modeling component can model a quantum device element of a quantum computing device as an electromagnetic circuit element to generate electromagnetic circuit data for the quantum computing device. The simulation component can simulate the quantum computing device using the electromagnetic circuit data to generate response function data indicative of a response function for the quantum computing device. The simulation component can also generate Hamiltonian data based on the response function data, wherein the Hamiltonian data is indicative of information associated with energy of the quantum computing device. The design component can generate design data indicative of a layout for the quantum computing device based on the Hamiltonian data. In an embodiment, the system can minimize an amount of time to design the quantum computing device and/or can reduce an amount of computational resources employed to design the quantum computing device. In certain embodiments, the quantum device element is a first quantum device element of the quantum computing device, and the modeling component can generate connection data indicative of information associated with a connection between the first quantum device element and a second quantum device element of the quantum computing device. In certain embodiments, the modeling component can generate the electromagnetic circuit data for the quantum computing device based on the connection data.

According to yet another embodiment, a computer-implemented method is provided. The computer-implemented method can comprise modeling, by a system operatively coupled to a processor, one or more quantum device elements of a quantum computing device as one or more electromagnetic circuit elements. The computer-implemented method can also comprise generating, by the system, an equivalent electromagnetic circuit for the quantum computing device based on the one or more electromagnetic circuit elements. Furthermore, the computer-implemented method can comprise simulating, by the system, the equivalent electromagnetic circuit to generate response function data indicative of a response function for the quantum computing device. In an embodiment, the computer-implemented method can minimize an amount of time to design the quantum computing device and/or can reduce an amount of computational resources employed to design the quantum computing device. The computer-implemented method can also comprise generating, by the system, a Hamiltonian and a set of Hamiltonian parameters for the quantum computing device using the response function. Furthermore, the computer-implemented method can comprise generating, by the system, a layout for the quantum computing device based on the set of Hamiltonian parameters. In certain embodiments, the computer-implemented method can also comprise re-simulating, by the system, the equivalent electromagnetic circuit in response to a determination that a Hamiltonian parameter from the set of Hamiltonian parameters satisfies a defined criterion.

DESCRIPTION OF THE DRAWINGS

FIG. 4 illustrates an example, non-limiting system that includes a quantum device element and an electromagnetic circuit element in accordance with one or more embodiments described herein.

DETAILED DESCRIPTION

Figure 1:
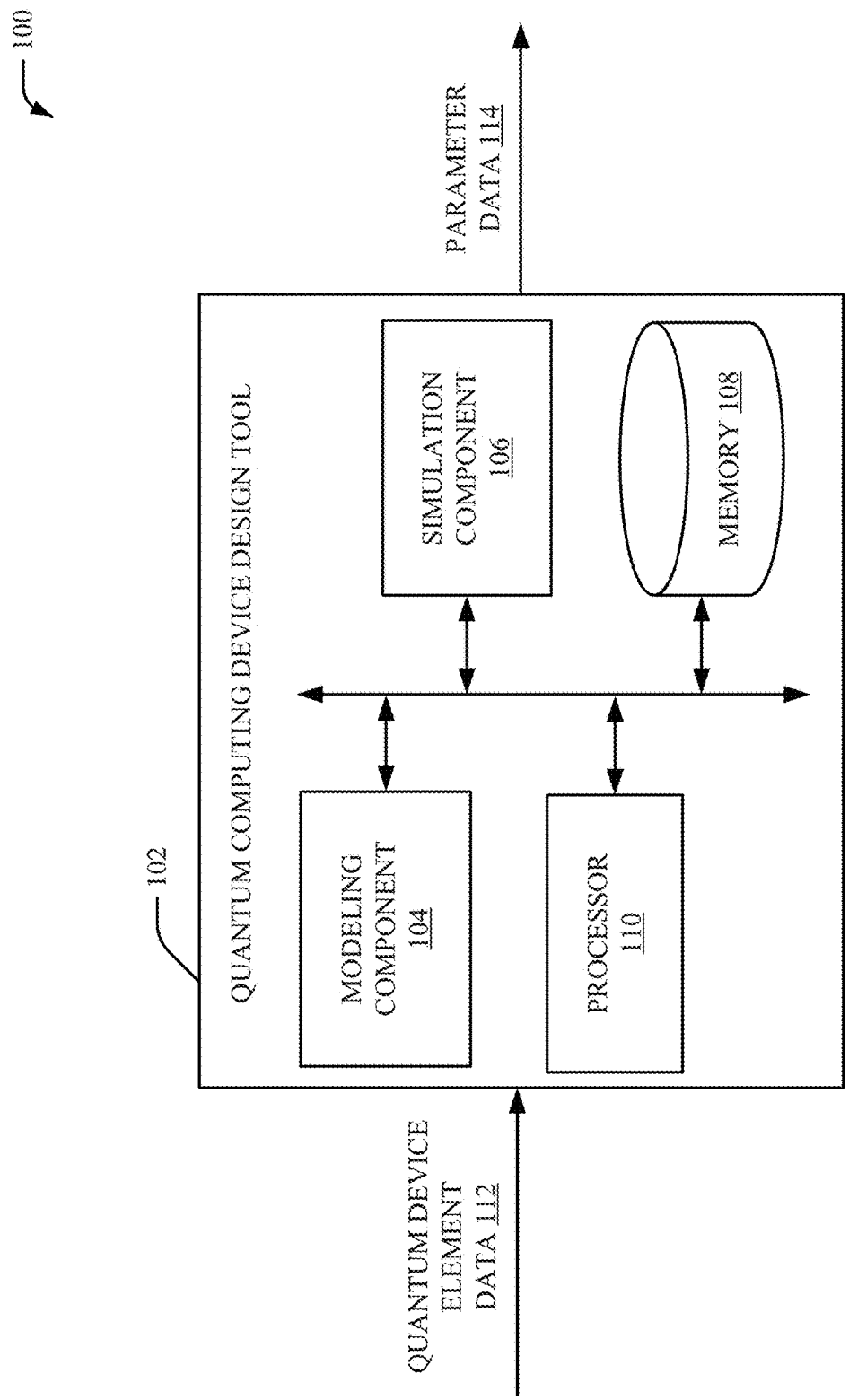
FIG. 1 illustrates a block diagram of an example, non-limiting system that includes a quantum computing device component in accordance with one or more embodiments described herein.

The following detailed description is merely illustrative and is not intended to limit embodiments and/or application or uses of embodiments. Furthermore, there is no intention to be bound by any expressed or implied information presented in the preceding Background or Summary sections, or in the Detailed Description section.

One or more embodiments are now described with reference to the drawings, wherein like referenced numerals are used to refer to like elements throughout. In the following description, for purposes of explanation, numerous specific details are set forth in order to provide a more thorough understanding of the one or more embodiments. It is evident, however, in various cases, that the one or more embodiments can be practiced without these specific details.

Quantum computing employs quantum physics to encode information rather than binary digital techniques based on transistors. For example, a quantum computing device can employ quantum bits (e.g., qubits) that operate according to a superposition principle of quantum physics and an entanglement principle of quantum physics. The superposition principle of quantum physics allows each qubit to represent both a value of "1" and a value of "0" at the same time. The entanglement principle of quantum physics states allows qubits in a superposition to be correlated with each other. For instance, a state of a first value (e.g., a value of "1" or a value of "0") can depend on a state of a second value. As such, a quantum computing device can employ qubits to encode information rather than binary digital techniques based on transistors. However, design of a quantum computing device is generally difficult and/or time consuming as compared to conventional binary digital devices. For instance, Svore, et al., "Toward a Software Architecture for Quantum Computing Design Tools," discloses "a computer-aided design flow that transforms a high-level language program representing a quantum computing algorithm into a technology-specific implementation . . . . The design flow (FIG. 1) is a four-phase process that maps a high-level program representing a quantum algorithm into a technology-specific implementation or simulation. The first three phases of the design flow are part of the quantum computer compiler (QCC). The last phase is a simulation or an implementation of the quantum algorithm on a quantum device." (See Abstract, FIG. 1 and page 3 of Svore et al.). As such, a design process for a quantum computing device and/or a design of quantum computing device can be improved.

To address these and/or other issues, embodiments described herein include systems, computer-implemented methods, and computer program products for improved quantum computing device design. In an aspect, a quantum computing device can be designed by employing an equivalent electromagnetic circuit. For example, a circuit design and/or a Hamiltonian calculation for designing a quantum computing device can be determined based on an electromagnetic circuit that is equivalent to one or more quantum device elements for the quantum computing device. The Hamiltonian calculation can be, for example, indicative of information associated with energy and/or electromagnetic properties of the quantum computing device. As such, an improved turnaround between circuit design and a Hamiltonian calculation for the circuit design can be realized. In an embodiment, one or more quantum device elements of a quantum computing device can be modeled to determine an equivalent electromagnetic circuit element. Based on one or more connections associated with the one or more quantum device elements, an equivalent electromagnetic circuit for the quantum computing device can be generated. The equivalent electromagnetic circuit can be simulated (e.g., rather than simulating a layout of the quantum computing device) to obtain response function data indicative of a response function for the quantum computing device. The response function data (e.g., the response function for the quantum computing device) can include, for example, an impedance, an admittance and/or another electrical parameter for the quantum computing device. In an aspect, a modeling tool can be employed to calculate one or more parameters from the response function for the quantum computing device. For example, a Hamiltonian modeling tool can be employed to calculate one or more Hamiltonian parameters from the response function for the quantum computing device. In one example, a black-box quantization technique associated with nonlinear elements for quantum information processing can be employed to calculate one or more Hamiltonian parameters from the response function for the quantum computing device. As such, an amount of time to design a quantum computing device can be reduced. For instance, an amount of time to prepare and/or simulate a quantum computing device can be reduced. Furthermore, an amount of computational resources employed to design a quantum computing device can be reduced. A design of a quantum computing device can also be optimized. Additionally, accuracy of a quantum computing device design system and/or efficiency of a quantum computing device design system can be improved. Moreover, quality of a quantum computing device can be improved, performance a quantum computing device can be improved, efficiency of a quantum computing device can be improved, timing characteristics of a quantum computing device can be improved, power characteristics of a quantum computing device can be improved, and/or another characteristic of a quantum computing device can be improved.

FIG. 1 illustrates a block diagram of an example, non-limiting system 100 for quantum computing device design in accordance with one or more embodiments described herein. In various embodiments, the system 100 can be a quantum computing device design system associated with technologies such as, but not limited to, quantum computing device technologies, quantum computing design technologies, qubit technologies, quantum computing device modeling technologies, quantum circuit technologies, quantum computing device simulation technologies, quantum processor technologies, artificial intelligence technologies, medicine and materials technologies, supply chain and logistics technologies, financial services technologies, and/or other digital technologies. The system 100 can employ hardware and/or software to solve problems that are highly technical in nature, that are not abstract and that cannot be performed as a set of mental acts by a human. Further, in certain embodiments, some of the processes performed may be performed by one or more specialized computers (e.g., one or more specialized processing units, a specialized computer with a quantum computing device design tool, etc.) for carrying out defined tasks related to machine learning. The system 100 and/or components of the system 100 can be employed to solve new problems that arise through advancements in technologies mentioned above, computer architecture, and/or the like. One or more embodiments of the system 100 can provide technical improvements to quantum computing device systems, quantum computing design systems, qubit systems, quantum computing device modeling systems, quantum circuit systems, quantum computing device simulation systems, quantum processor systems, artificial intelligence systems, medicine and materials systems, supply chain and logistics systems, financial services systems, and/or other systems. One or more embodiments of the system 100 can also provide technical improvements to a quantum computing device (e.g., a quantum processor) by improving processing performance of the quantum computing device, improving processing efficiency of the quantum computing device, improving processing characteristics of the quantum computing device, improving timing characteristics of the quantum computing device and/or improving power efficiency of the quantum computing device.

In the embodiment shown in FIG. 1, the system 100 can include a quantum computing device design tool 102. As shown in FIG. 1, the quantum computing device design tool 102 can include a modeling component 104 and a simulation component 106. Aspects of the quantum computing device design tool 102 can constitute machine-executable component(s) embodied within machine(s), e.g., embodied in one or more computer readable mediums (or media) associated with one or more machines. Such component(s), when executed by the one or more machines, e.g., computer(s), computing device(s), virtual machine(s), etc. can cause the machine(s) to perform the operations described. In an aspect, the quantum computing device design tool 102 can also include memory 108 that stores computer executable components and instructions. Furthermore, the quantum computing device design tool 102 can include a processor 110 to facilitate execution of the instructions (e.g., computer executable components and corresponding instructions) by the quantum computing device design tool 102. As shown, the modeling component 104, the simulation component 106, the memory 108 and/or the processor 110 can be electrically and/or communicatively coupled to one another in one or more embodiments.

The quantum computing device design tool 102 (e.g., the modeling component 104 of the quantum computing device design tool 102) can receive quantum device element data 112. The quantum device element data 112 can be, for example, a machine-readable description of one or more quantum device elements of a quantum computing device. Additionally or alternatively, the quantum device element data can be associated with one or more models for one or more quantum device elements of the quantum computing device. The quantum computing device can be, for example, a quantum circuit, a quantum processor, a qubit device, a qubit unit cell, and/or another type of computing device that employs qubits. A quantum device element from the one or more quantum device elements can include, for example, a qubit element of the quantum computing device, a coupler of the quantum computing device, a readout of the quantum computing device, a bus of the quantum computing device, or another element of the quantum computing device. In an embodiment, the quantum device element data 112 can be associated with a model of the quantum computing device. For instance, the model of the quantum computing device can be generated by a computer simulator. The computer simulator can be, for example, a static field simulator that performs one or more electromagnetic field simulations associated with the quantum computing device. In one example, the model of the quantum computing device can be a two-dimensional model. In another example, the model of the quantum computing device can be a three-dimensional model.

The modeling component 104 can model a quantum device element associated with the quantum device element data 112 as an electromagnetic circuit element to generate electromagnetic circuit data for the quantum computing device. For example, the modeling component 104 can model a quantum device element of a quantum computing device as an electromagnetic circuit element to generate electromagnetic circuit data for the quantum computing device. An electromagnetic circuit element can be, for example, an inductor, a capacitor, a resistor, an inductor-capacitor network, an inductor-resistor network, an inductor-capacitor-resistor network, a capacitor-resistor network, a resonator, a microwave resonator, another type of electromagnetic circuit element, etc. In an embodiment, the modeling component 104 can generate connection data indicative of information associated with one or more connections between quantum device elements of the quantum computing device. For example, the modeling component 104 can generate connection data indicative of information associated with a connection between a first quantum device element of the quantum computing device and a second quantum device element of the quantum computing device. In an aspect, the modeling component 104 can generate the electromagnetic circuit data for the quantum computing device based on the connection data. In certain embodiments, the modeling component 104 can model the quantum device element of the quantum computing device as the electromagnetic circuit element based on a library of electromagnetic circuit elements. For example, the library of electromagnetic circuit elements can include a set of predetermined electromagnetic circuit elements that correspond to quantum device elements. Additionally or alternatively, in certain embodiments, the quantum device element data 112 can additionally include location data indicative of information for one or more locations associated quantum device elements within the quantum computing circuit. For example, the location data can include one or more tags that tag a location of one or more quantum device elements within the quantum computing circuit.

The simulation component 106 can simulate the quantum computing device using the electromagnetic circuit data to generate parameter data 114 for the quantum computing device. In an embodiment, the parameter data can include response function data. For example, the simulation component 106 can simulate the quantum computing device using the electromagnetic circuit data to generate response function data for the quantum device. The response function data can be indicative of a response function for the quantum computing device. In one example, the response function can be a multi-dimensional response function of the quantum computing device. In another embodiment, the parameter data can include Hamiltonian data. For example, the simulation component 106 can generate, based on the response function data, the Hamiltonian data. In one example, the Hamiltonian data can be calculated from the response function. The Hamiltonian data can be indicative of information associated with energy of the quantum computing device and/or electromagnetic properties of the quantum computing device. In an aspect, the Hamiltonian data can facilitate an understanding of crosstalk, interconnections, connectors, printed circuit board layout, electrical buses, and/or other electrical properties associated with the quantum computing device. In certain embodiments, the simulation component 106 can re-simulate the quantum computing device using the electromagnetic circuit data in response to a determination that the Hamiltonian data satisfies a defined criterion. For example, the simulation component 106 can re-simulate the quantum computing device using the electromagnetic circuit data until a desired Hamiltonian value associated with the Hamiltonian data is obtained.

In certain embodiments, the modeling component 104 can generate the generate electromagnetic circuit data based on classifications, correlations, inferences and/or expressions associated with principles of artificial intelligence. For instance, the modeling component 104 can employ an automatic classification system and/or an automatic classification process to classify one or more quantum devices elements and/or to generate the electromagnetic circuit data. In one example, the modeling component 104 can employ a probabilistic and/or statistical-based analysis (e.g., factoring into the analysis utilities and costs) to learn and/or generate inferences with respect to one or more quantum device elements. In an aspect, the modeling component 104 can include an inference component (not shown) that can further enhance aspects of the modeling component 104 utilizing in part inference based schemes to facilitate learning and/or generating inferences associated with one or more quantum device elements. The modeling component 104 can employ any suitable machine-learning based techniques, statistical-based techniques and/or probabilistic-based techniques. For example, the modeling component 104 can employ expert systems, fuzzy logic, SVMs, Hidden Markov Models (HMMs), greedy search algorithms, rule-based systems, Bayesian models (e.g., Bayesian networks), neural networks, other non-linear training techniques, data fusion, utility-based analytical systems, systems employing Bayesian models, etc. In another aspect, the modeling component 104 can perform a set of machine learning computations associated with generation of the electromagnetic circuit data. For example, the modeling component 104 can perform a set of clustering machine learning computations, a set of logistic regression machine learning computations, a set of decision tree machine learning computations, a set of random forest machine learning computations, a set of regression tree machine learning computations, a set of least square machine learning computations, a set of instance-based machine learning computations, a set of regression machine learning computations, a set of support vector regression machine learning computations, a set of k-means machine learning computations, a set of spectral clustering machine learning computations, a set of rule learning machine learning computations, a set of Bayesian machine learning computations, a set of deep Boltzmann machine computations, a set of deep belief network computations, and/or a set of different machine learning computations to determine the electromagnetic circuit data.

It is to be appreciated that the quantum computing device design tool 102 (e.g., the modeling component 104 and/or the simulation component 106) performs a quantum computing device design process that cannot be performed by a human (e.g., is greater than the capability of a single human mind). For example, an amount of data processed, a speed of data processed and/or data types of data processed by the quantum computing device design tool 102 (e.g., the modeling component 104 and/or the simulation component 106) over a certain period of time can be greater, faster and different than an amount, speed and data type that can be processed by a single human mind over the same period of time. The quantum computing device design tool 102 (e.g., the modeling component 104 and/or the simulation component 106) can also be fully operational towards performing one or more other functions (e.g., fully powered on, fully executed, etc.) while also performing the above-referenced quantum computing device design process. Moreover, parameter data and/or design data generated by the quantum computing device design tool 102 (e.g., the modeling component 104 and/or the simulation component 106) can include information that is impossible to obtain manually by a user. For example, a type of information included in the parameter data 114, a variety of information included in the parameter data 114, and/or optimization of the parameter data 114 can be more complex than information obtained manually by a user.

Additionally, it is to be appreciated that the system 100 can provide various advantages as compared to conventional design tools for a quantum computing device. For instance, an amount of time to design a quantum computing device can be reduced by employing the system 100. Furthermore, an amount of time to prepare and/or simulate a quantum computing device can be reduced by employing the system 100. Also, an amount of computational resources employed to design a quantum computing device can be reduced by employing the system 100. A design of a quantum computing device can also be optimized by employing the system 100. Additionally, accuracy of a quantum computing device design system and/or efficiency of a quantum computing device design system can be improved. Moreover, quality of a quantum computing device can be improved, performance a quantum computing device can be improved, efficiency of a quantum computing device can be improved, timing characteristics of a quantum computing device can be improved, power characteristics of a quantum computing device can be improved, and/or another characteristic of a quantum computing device can be improved by employing the system 100.

Figure 2:
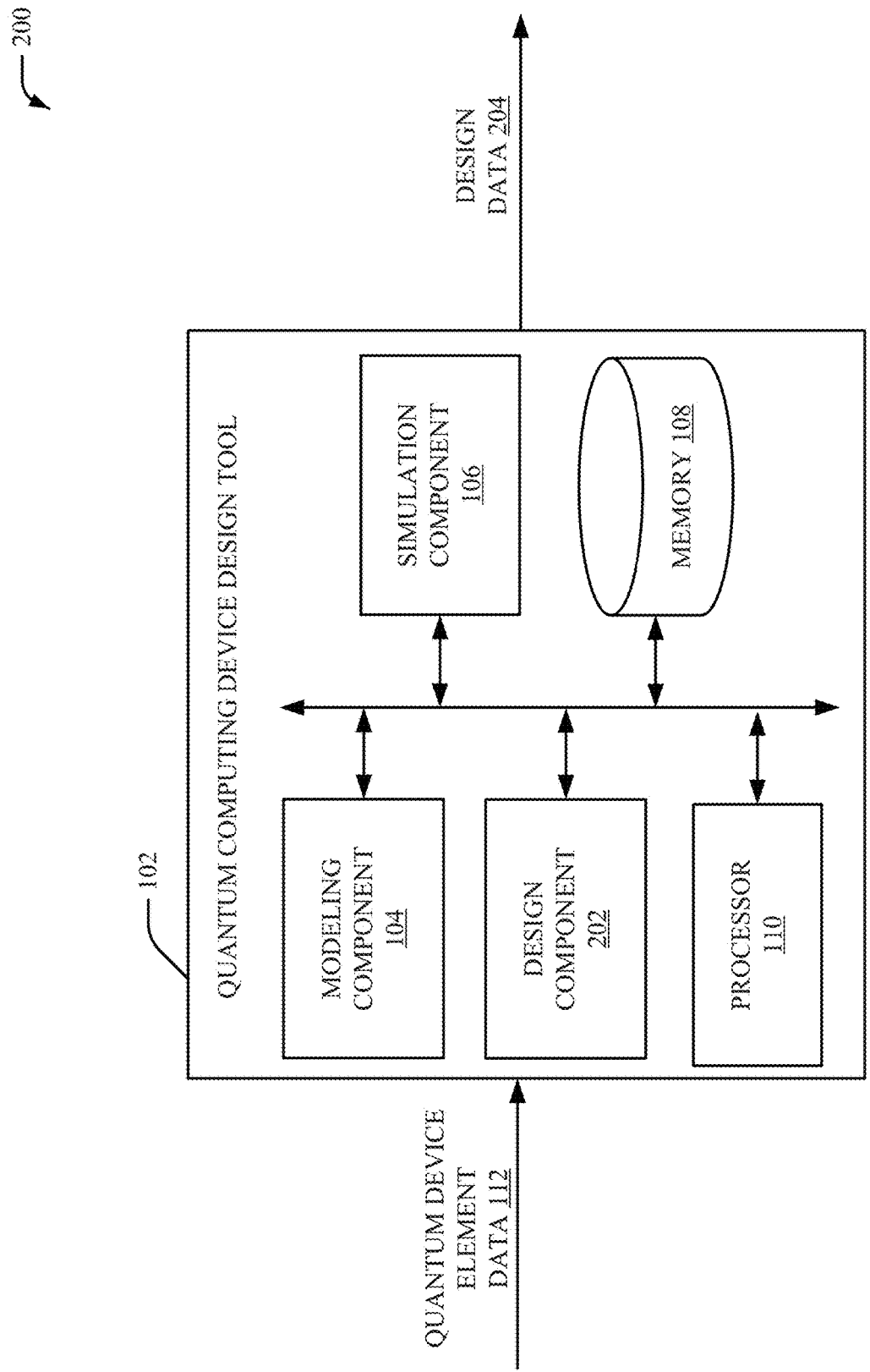
FIG. 2 illustrates a block diagram of another example, non-limiting system that includes a quantum computing device component in accordance with one or more embodiments described herein.

FIG. 2 illustrates a block diagram of an example, non-limiting system 200 in accordance with one or more embodiments described herein. Repetitive description of like elements employed in other embodiments described herein is omitted for sake of brevity.

The system 200 includes the quantum computing device design tool 102. The quantum computing device design tool 102 shown in FIG. 2 can include the modeling component 104, the simulation component 106, the memory 108, the processor 110 and/or a design component 202. The design component 202 can generate design data 204 based on the parameter data 114. The design data 204 can be indicative of a layout for the quantum computing device. For example, the design data 204 can include a location for one or more components within the quantum computing device. Additionally or alternatively, the design data 204 can include an electrical parameter for one or more components within the quantum computing device. Additionally or alternatively, the design data 204 can include a value and/or settings for one or more components within the quantum computing device. Additionally or alternatively, the design data 204 can include a size, a shape and/or an arrangement for one or more components within the quantum computing device. In an embodiment, a layout for the quantum computing device can be modified based on the parameter data. In another embodiment, the design component 202 can generate the design data 204 based on the response function data. In another embodiment, the design component 202 can generate the design data 204 based on the Hamiltonian data. In certain embodiments, a layout for the quantum computing device can be modified based on the response function data and/or the Hamiltonian data.

It is to be appreciated that the system 200 can provide various advantages as compared to conventional design tools for a quantum computing device. For instance, an amount of time to design a quantum computing device can be reduced by employing the system 200. Furthermore, an amount of time to prepare and/or simulate a quantum computing device can be reduced by employing the system 200. Also, an amount of computational resources employed to design a quantum computing device can be reduced by employing the system 200. A design of a quantum computing device can also be optimized by employing the system 200. Additionally, accuracy of a quantum computing device design system and/or efficiency of a quantum computing device design system can be improved. Moreover, quality of a quantum computing device can be improved, performance a quantum computing device can be improved, efficiency of a quantum computing device can be improved, timing characteristics of a quantum computing device can be improved, power characteristics of a quantum computing device can be improved, and/or another characteristic of a quantum computing device can be improved by employing the system 200.

Figure 3:
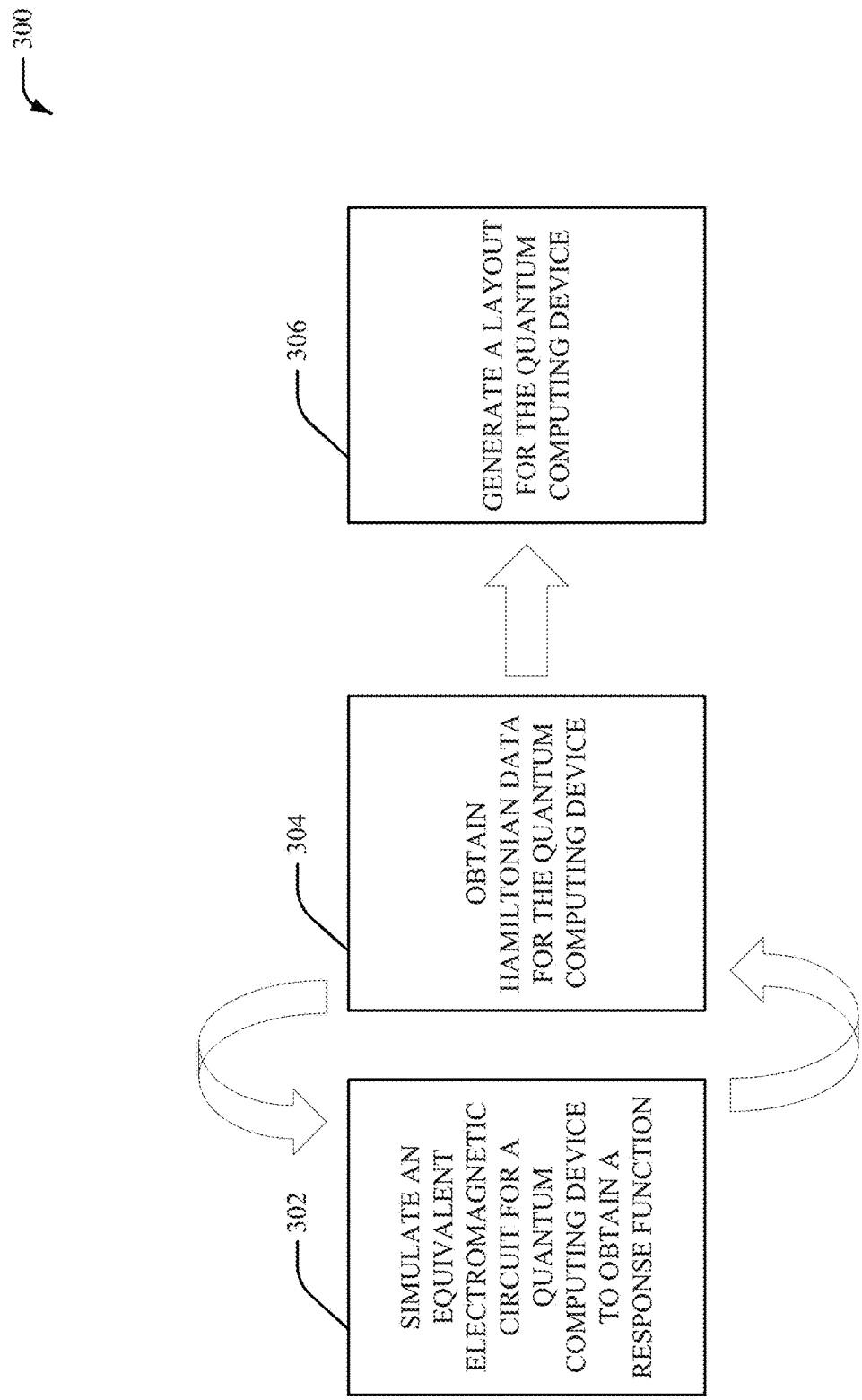
FIG. 3 illustrates an example, non-limiting system that facilitates quantum computing device design in accordance with one or more embodiments described herein.

FIG. 3 illustrates a block diagram of an example, non-limiting system 300 in accordance with one or more embodiments described herein. Repetitive description of like elements employed in other embodiments described herein is omitted for sake of brevity.

The system 300 includes a design process 302 to simulate an equivalent electromagnetic circuit for a quantum computing device to obtain a response function, a design process 304 to obtain Hamiltonian data for the quantum computing device based on a response function, and a design process 306 to generate a layout for a quantum computing device based on the Hamiltonian data. In an embodiment, the Hamiltonian data can be obtained (e.g., via the design process 304) based on the response function obtained via the design process 302. The Hamiltonian data can be associated with, for example, electromagnetic properties of the quantum computing device and/or information associated with energy at one more locations of the quantum computing device. In another embodiment, simulation of the equivalent electromagnetic circuit can be repeated via the design process 302 in response to a determination that the Hamiltonian data obtained via the design process 304 satisfies a defined criterion. The layout for the quantum computing device can be generated via the design process 306 based on the Hamiltonian data obtained via the design process 304. It is to be appreciated that, conventionally, a layout for a quantum computing device is drawn and the layout for the quantum computing device is simulated to facilitate design of the quantum computing device. In contrast, the quantum computing device design tool 102 can simulate an equivalent electromagnetic circuit to obtain a response function via the design process 302, obtain Hamiltonian data for the quantum computing device via the design process 304, and generate a layout for a quantum computing device via design process 306 based on the Hamiltonian data to facilitate reduced simulation cost and/or a reduction in computational power during simulation.

FIG. 4 illustrates a block diagram of an example, non-limiting system 400 in accordance with one or more embodiments described herein. Repetitive description of like elements employed in other embodiments described herein is omitted for sake of brevity.

The system 400 includes a quantum device element 402 and an electromagnetic circuit element 404. In an embodiment, the modeling component 104 can generate the electromagnetic circuit element 404 from the quantum device element 402. The quantum device element 402 can be for example, a qubit element of a quantum computing device, a coupler of a quantum computing device, a readout of a quantum computing device, a bus of a quantum computing device, or another element of a quantum computing device. The quantum device element 402 can also be associated with a particular portion of a quantum computing device (e.g., a particular area of a quantum computing device). In one example, the quantum device element 402 can be a superconducting transmon qubit layout without a junction. A transmon can be a qubit designed to comprise reduced sensitivity to noise associated with electrical charges. The electromagnetic circuit element 404 can be, for example, a capacitance network. In an embodiment, one or more capacitance values can be determined from a static simulation of the quantum device element 402.

Figure 5:
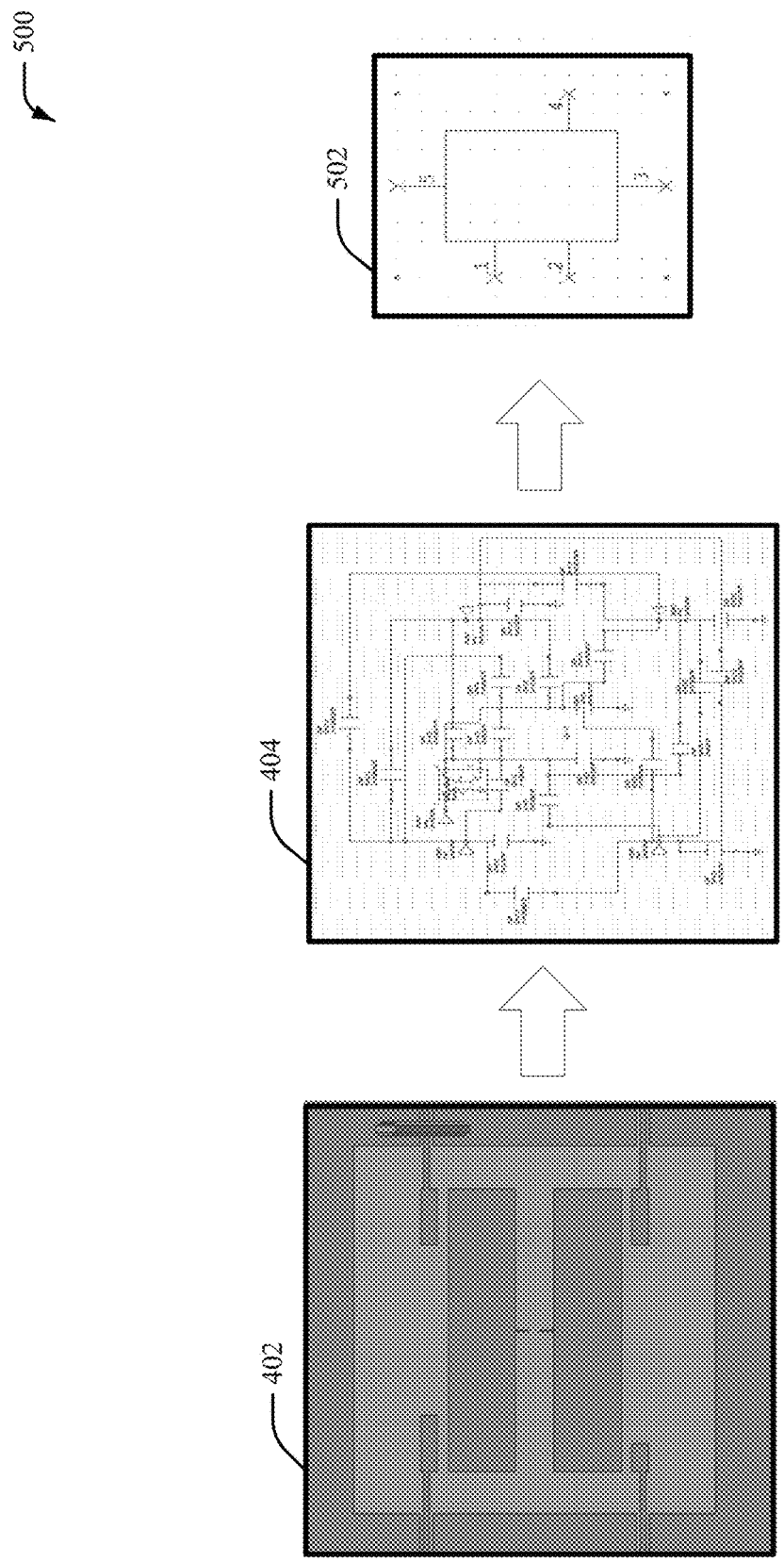
FIG. 5 illustrates an example, non-limiting system that includes a quantum device element, an electromagnetic circuit element and a schematic element in accordance with one or more embodiments described herein.

FIG. 5 illustrates a block diagram of an example, non-limiting system 500 in accordance with one or more embodiments described herein. Repetitive description of like elements employed in other embodiments described herein is omitted for sake of brevity.

The system 500 includes the quantum device element 402, the electromagnetic circuit element 404 and a schematic element 502. In an embodiment, the modeling component 104 can generate the schematic element 502. The schematic element 502 can be generated based on the electromagnetic circuit element 404 associated with the quantum device element 402. In an embodiment, the schematic element 502 can be stored in a library of electromagnetic circuit elements. In another embodiment, the schematic element 502 can be employed by a simulation tool to facilitate simulation of the quantum device element 402 and/or a quantum device associated with the quantum device element 402. Additionally, in certain embodiments, the modeling component 104 can identify and/or model a quantum device element based on the schematic element 502. In an aspect, the schematic element 502 can represent functionality of the electromagnetic circuit element 404. For example, the schematic element 502 can be a black box component with functionality that corresponds to the electromagnetic circuit element 404

Figure 6:
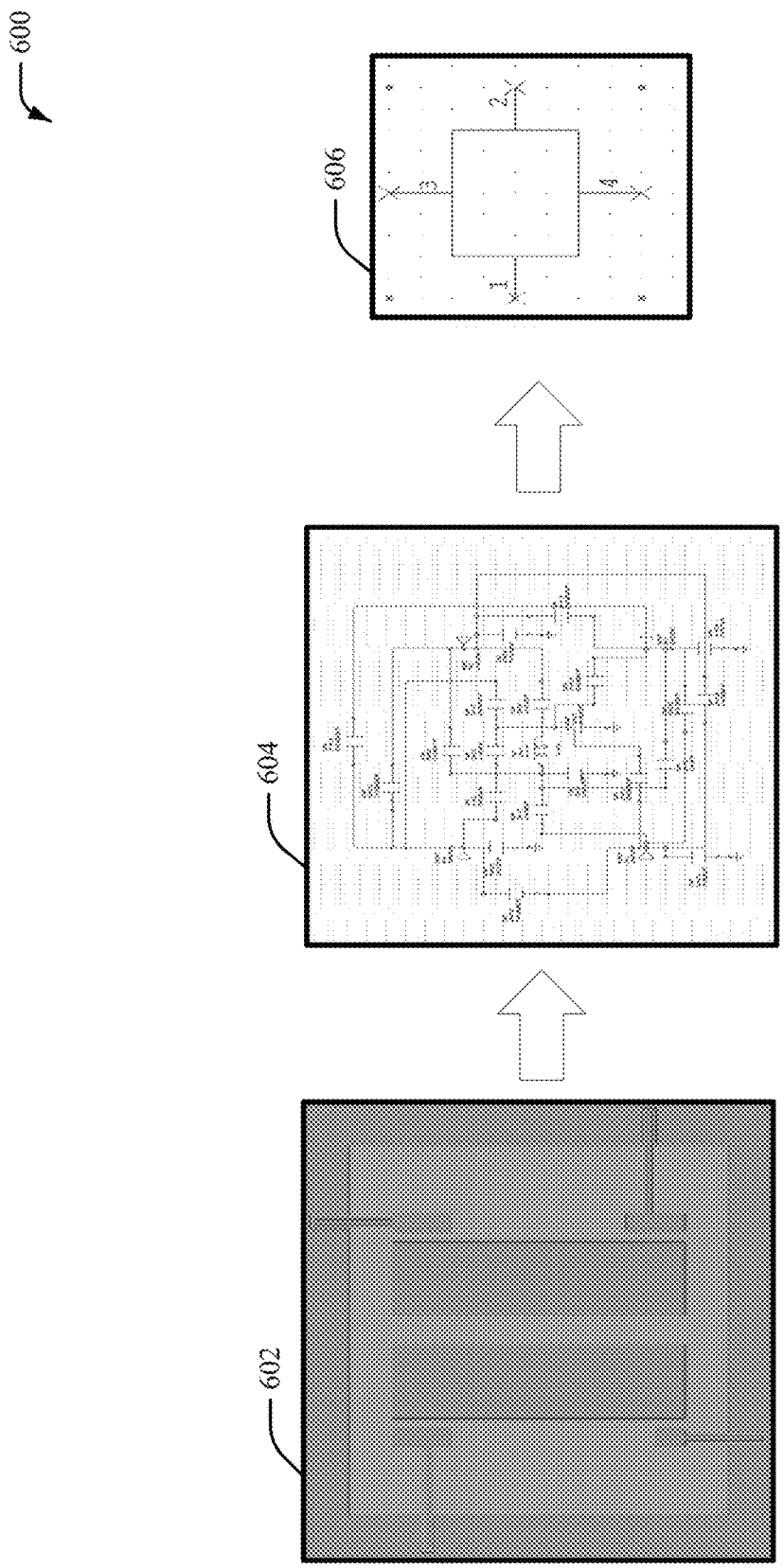
FIG. 6 illustrates another example, non-limiting system that includes a quantum device element, an electromagnetic circuit element and a schematic element in accordance with one or more embodiments described herein.

FIG. 6 illustrates a block diagram of an example, non-limiting system 600 in accordance with one or more embodiments described herein. Repetitive description of like elements employed in other embodiments described herein is omitted for sake of brevity.

The system 600 includes a quantum device element 602, an electromagnetic circuit element 604 and a schematic element 606. In an embodiment, the modeling component 104 can generate the electromagnetic circuit element 604 and/or the schematic element 606. In one example, the quantum device element 602 can be a qubit layout. The electromagnetic circuit element 604 can be, for example, a capacitance network. The schematic element 606 can be generated based on the electromagnetic circuit element 604 associated with the quantum device element 602. In an embodiment, the schematic element 606 can be stored in a library of electromagnetic circuit elements. In another embodiment, the schematic element 606 can be employed by a simulation tool to facilitate simulation of the quantum device element 602 and/or a quantum device associated with the quantum device element 602. Additionally, in certain embodiments, the modeling component 104 can identify and/or model a quantum device element based on the schematic element 606.

Figure 7:
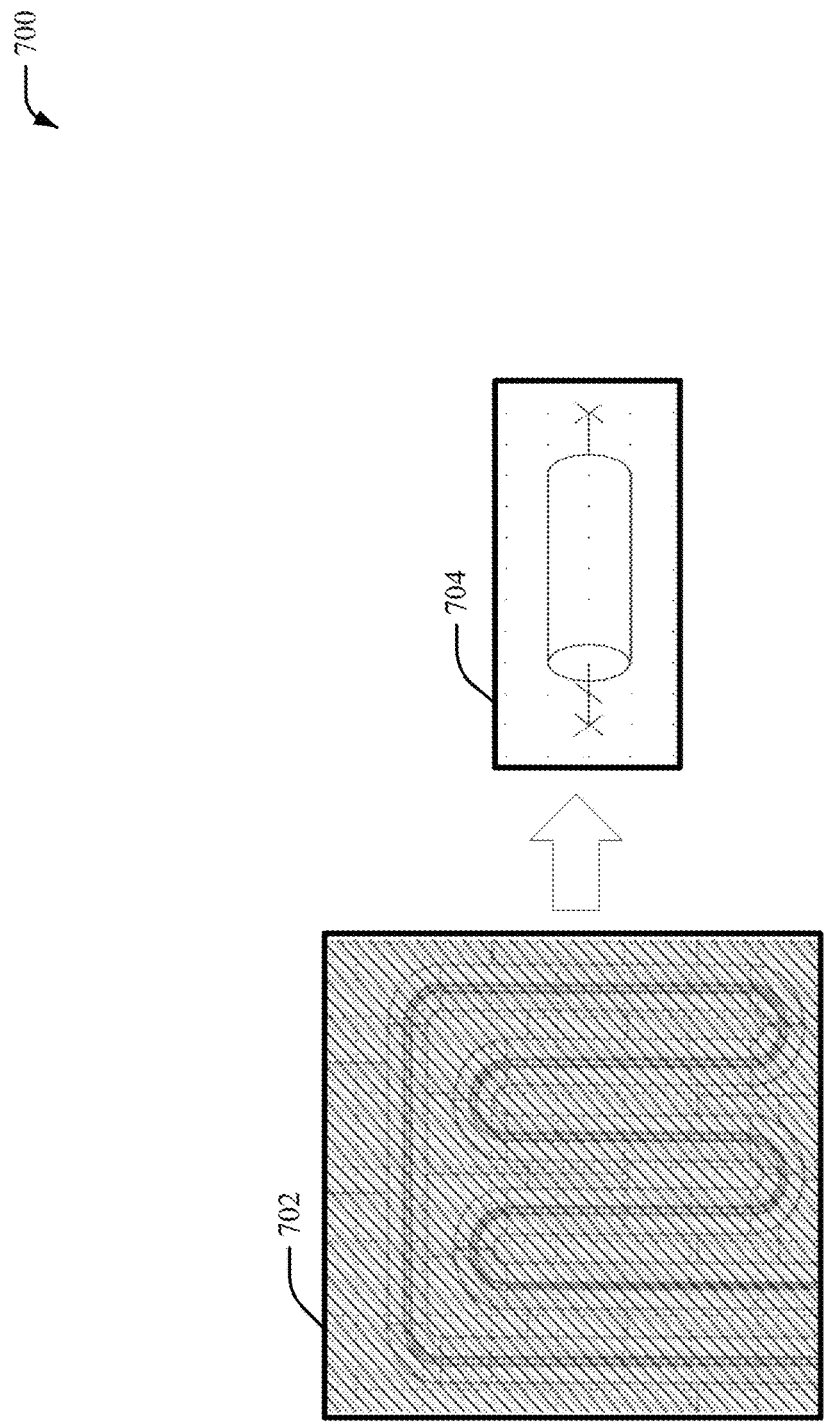
FIG. 7 illustrates another example, non-limiting system that includes a quantum device element and an electromagnetic circuit element in accordance with one or more embodiments described herein.

FIG. 7 illustrates a block diagram of an example, non-limiting system 700 in accordance with one or more embodiments described herein. Repetitive description of like elements employed in other embodiments described herein is omitted for sake of brevity.

The system 700 includes a quantum device element 702 and an electromagnetic circuit element 704. In an embodiment, the modeling component 104 can generate the electromagnetic circuit element 704. In certain embodiments, the electromagnetic circuit element 704 can also be a schematic element. In one example, the quantum device element 702 can be a portion of a quantum computing device. The electromagnetic circuit element 704 can be, for example, a resonator element. The electromagnetic circuit element 704 can be generated the quantum device element 702. In an embodiment, the electromagnetic circuit element 704 can be stored in a library of electromagnetic circuit elements. In another embodiment, the electromagnetic circuit element 704 can be employed by a simulation tool to facilitate simulation of the quantum device element 702 and/or a quantum device associated with the quantum device element 702. Additionally, in certain embodiments, the modeling component 104 can identify and/or model a quantum device element based on the electromagnetic circuit element 704.

Figure 8:
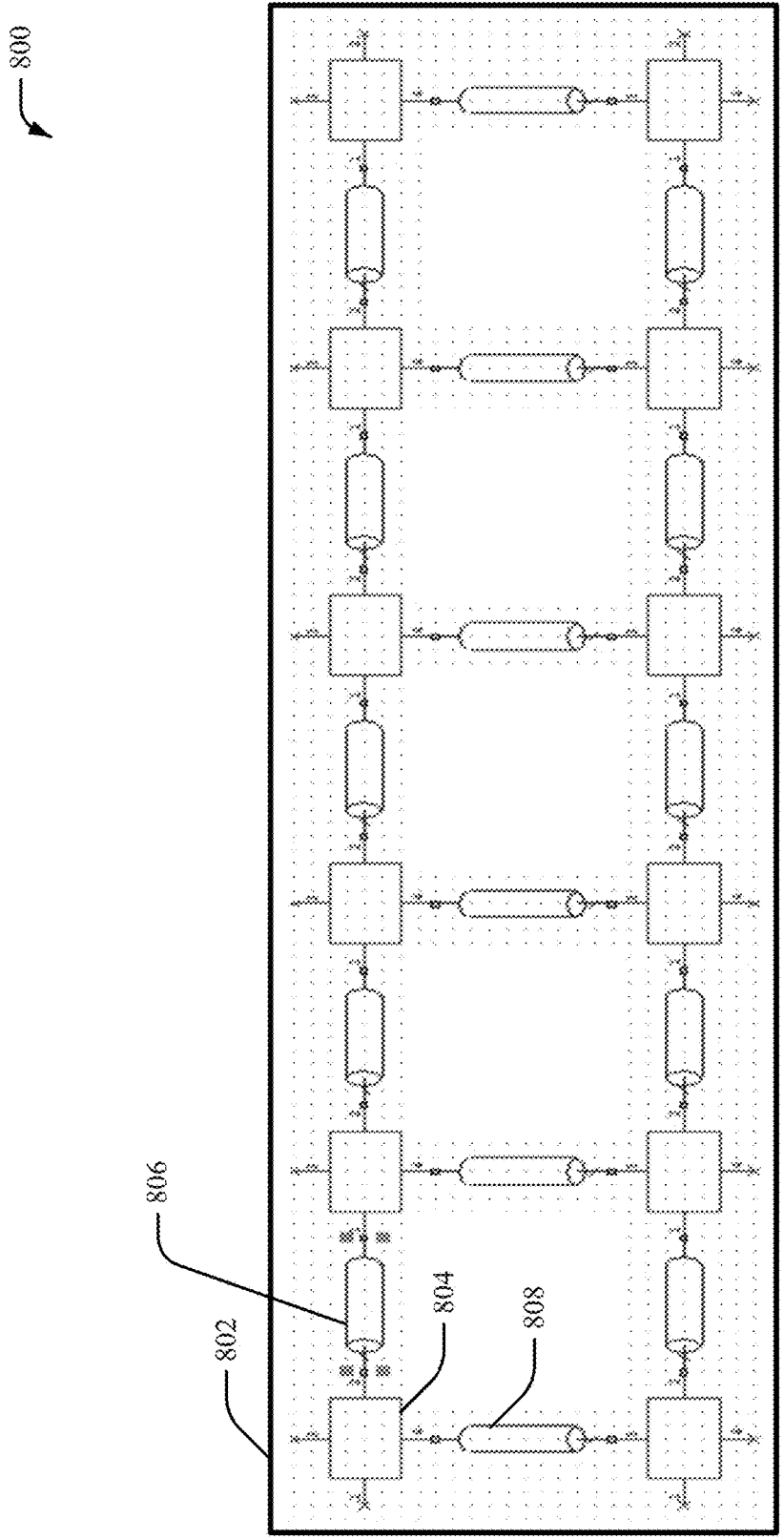
FIG. 8 illustrates an example, non-limiting system associated with an equivalent electromagnetic circuit in accordance with one or more embodiments described herein.

FIG. 8 illustrates a block diagram of an example, non-limiting system 800 in accordance with one or more embodiments described herein. Repetitive description of like elements employed in other embodiments described herein is omitted for sake of brevity.

The system 800 includes an equivalent electromagnetic circuit 802 for a quantum computing device. The equivalent electromagnetic circuit 802 can include a set of electromagnetic circuit element formatted as a set of schematic elements. For example, the equivalent electromagnetic circuit 802 can include a first electromagnetic circuit element formatted as a first schematic element 804, a second electromagnetic circuit element formatted as a second schematic element 806, a third electromagnetic circuit element formatted as a third schematic element 808, etc. In one example, the first schematic element 804 (e.g., the first electromagnetic circuit element) can be connected to the second schematic element 806 (e.g., the second electromagnetic circuit element) and the third schematic element 808 (e.g., the third electromagnetic circuit element). In an aspect, functionality of the equivalent electromagnetic circuit 802 can correspond to functionality of a quantum computing device associated with the equivalent electromagnetic circuit 802. For example, the modeling component 104 can model one or more quantum device elements of a quantum computing device to generate the set of electromagnetic circuit element within the equivalent electromagnetic circuit 802.

Figure 9:
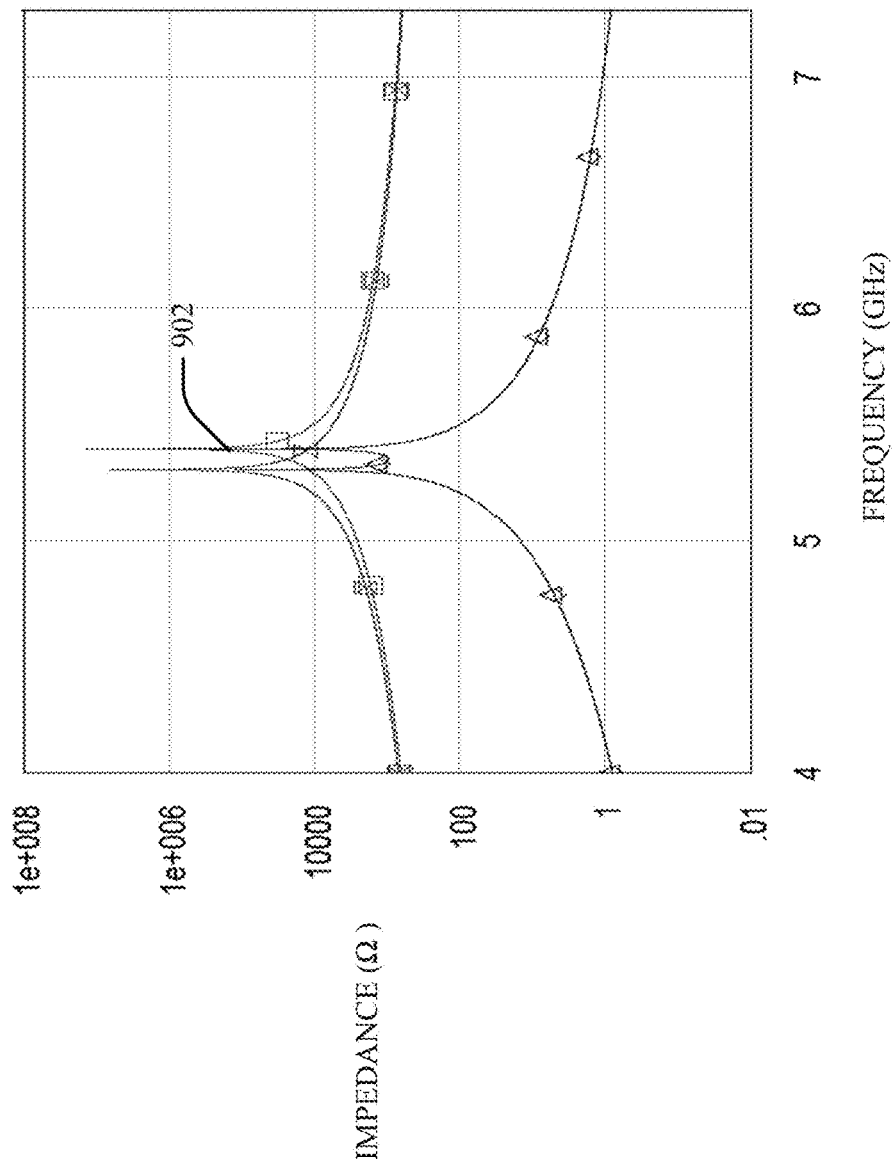
FIG. 9 illustrates an example, non-limiting graph associated with a response function in accordance with one or more embodiments described herein.

FIG. 9 illustrates a block diagram of an example, non-limiting graph 900 in accordance with one or more embodiments described herein. Repetitive description of like elements employed in other embodiments described herein is omitted for sake of brevity.

The graph 900 illustrates a response function 902 in accordance with one or more embodiments described herein. A horizontal axis of the graph 900 depicts frequency (GHz). A vertical axis of the graph 900 depicts impedance (a). In an embodiment, the response function 902 can be a response function generated by the simulation component 106 for a quantum computing device. In an aspect, Hamiltonian data for a quantum computing device can be determined based on the response function 902. The response function 902 can correspond to impedance and/or admittance at one or more locations within a quantum computing device.

Figure 10:
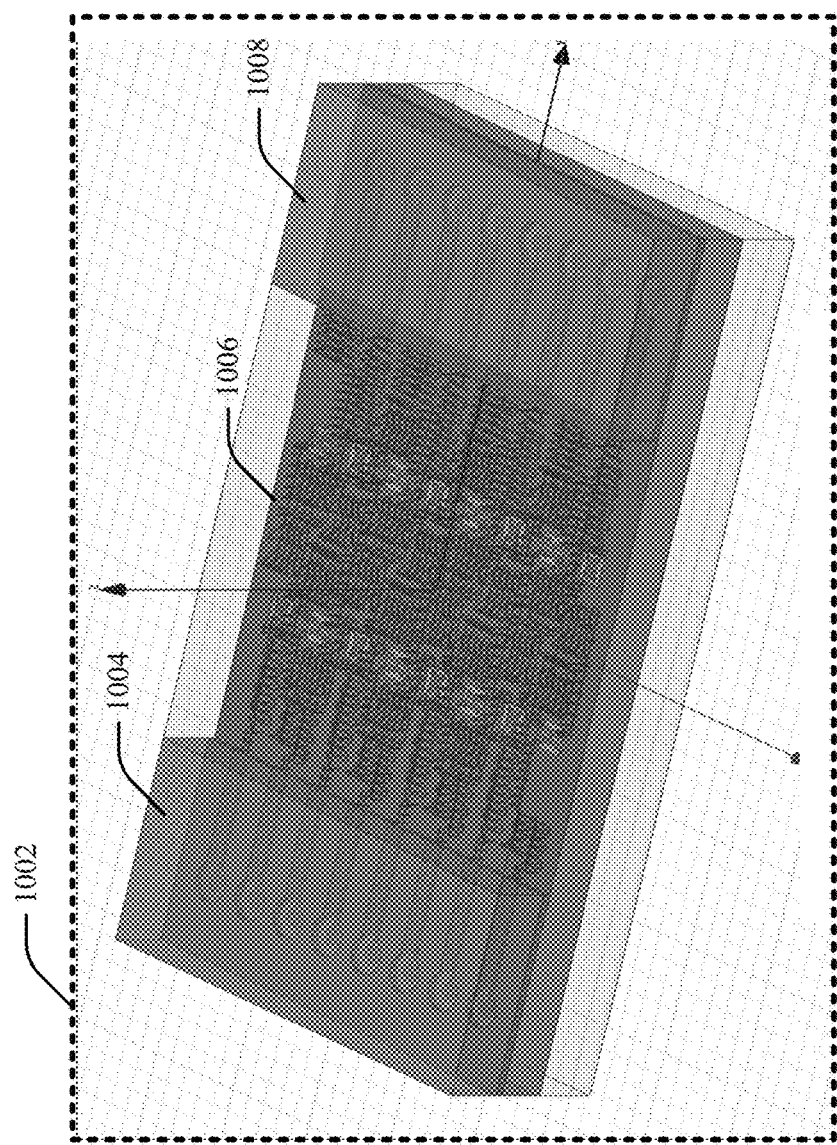
FIG. 10 illustrates an example, non-limiting quantum computing device in accordance with one or more embodiments described herein

FIG. 10 illustrates a block diagram of an example, non-limiting system 1000 in accordance with one or more embodiments described herein. Repetitive description of like elements employed in other embodiments described herein is omitted for sake of brevity.

The system 1000 can include a quantum computing device 1002. For example, the quantum computing device 1002 can be a model of a quantum computing device employed by the modeling component 104 to model one or more quantum device elements for the quantum computing device 1002. In an embodiment, the model of the quantum computing device 1002 can be generated by a computer simulator. The computer simulator can be, for example, a static field simulator that performs one or more electromagnetic field simulations associated with the quantum computing device 1002. The quantum computing device 1002 can be quantum circuit, a quantum processor, a qubit device, a qubit unit cell, and/or another type of computing device that employs qubits. In an aspect, the quantum computing device 1002 can include one or more quantum device elements such as, for example, a qubit element, a coupler element, a readout element, a bus element, or another element of the quantum computing device 1002. Furthermore, the quantum computing device 1002 can be a machine that performs a set of calculations based on principle of quantum physics. For example, the quantum computing device 1002 can encode information using qubits. In one embodiment, the quantum computing device 1002 can be a hardware quantum processor (e.g., a hardware superconducting quantum processor). For example, the quantum computing device 1002 can be a hardware quantum processor that executes a set of instruction threads using qubits. In a non-limiting example, a portion 1004 of the quantum computing device 1002 can correspond to a first quantum device element, a portion 1006 of the quantum computing device 1002 can correspond to a second quantum device element, and a portion 1008 of the quantum computing device 1002 can correspond to a third quantum device element.

Figure 11:
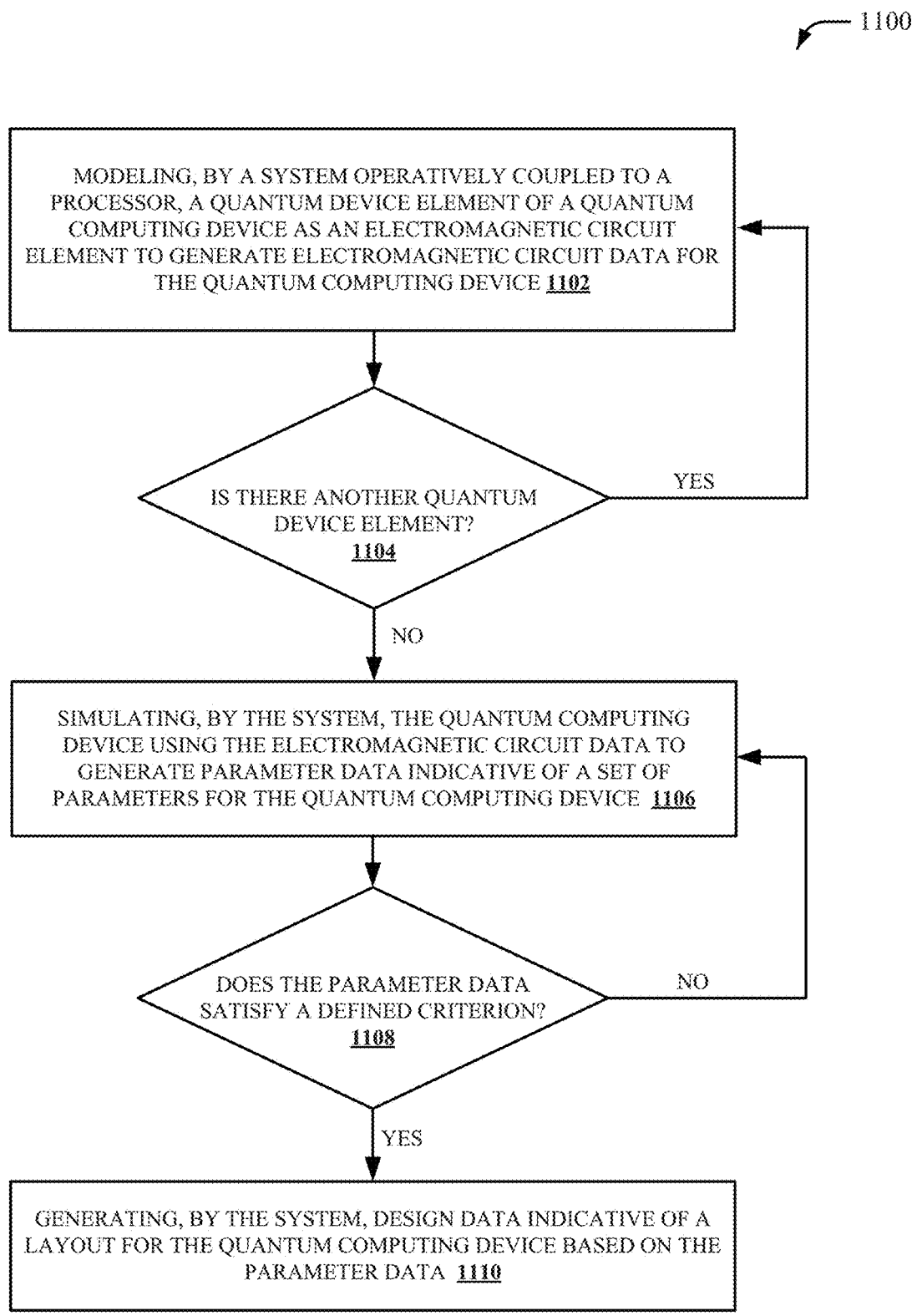
FIG. 11 illustrates a flow diagram of an example, non-limiting computer-implemented method for facilitating quantum computing device design in accordance with one or more embodiments described herein.

FIG. 11 illustrates a flow diagram of an example, non-limiting computer-implemented method 1100 for facilitating quantum computing device design in accordance with one or more embodiments described herein. At 1102, a quantum device element of a quantum computing device is modeled, by a system operatively coupled to a processor (e.g., by modeling component 104), as an electromagnetic circuit element to generate electromagnetic circuit data for the quantum computing device. The quantum device element data can be, for example, a machine-readable description of one or more quantum device elements of a quantum computing device. Additionally or alternatively, the quantum device element data can be associated with one or more models for one or more quantum device elements of the quantum computing device. The quantum computing device can be, for example, a quantum circuit, a quantum processor, a qubit device, a qubit unit cell, and/or another type of computing device that employs qubits. A quantum device element from the one or more quantum device elements can include, for example, a qubit element of the quantum computing device, a coupler of the quantum computing device, a readout of the quantum computing device, a bus of the quantum computing device, or another element of the quantum computing device. In an embodiment, connection data indicative of information associated with one or more connections between quantum device elements of the quantum computing device can be generated. Furthermore, the electromagnetic circuit data for the quantum computing device can be generated based on the connection data. In certain embodiments, the quantum device element of the quantum computing device can be modeled as the electromagnetic circuit element based on a library of electromagnetic circuit elements At 1104, it is determined whether there is another quantum device element. If yes, the computer-implemented method 1100 returns to 1102. If no, the computer-implemented method 1100 proceeds to 1106.

At 1106, the quantum computing device is simulated, by the system (e.g., by simulation component 106), using the electromagnetic circuit data to generate parameter data indicative of a set of parameters for the quantum computing device. In an embodiment, the quantum computing device can be simulated using the electromagnetic circuit data to generate response function data indicative of a response function for the quantum computing device. In yet another embodiment, Hamiltonian data can be generated based on the response function data. The Hamiltonian data can be indicative of information associated with energy of the quantum computing device and/or electromagnetic properties of the quantum computing device. In an aspect, the Hamiltonian data can facilitate an understanding of cross-talk, interconnections, connectors, printed circuit board layout, electrical buses, and/or other electrical properties associated with the quantum computing device.

At 1108, it is determined whether the parameter data satisfies a defined criterion. If no, the computer-implemented method 1100 returns to 1106. If yes, the computer-implemented method 1100 proceeds to 1108.

At 1110, design data indicative of a layout for the quantum computing device is generated, by the system (e.g., by design component 202), based on the parameter data. In an embodiment, a layout for the quantum computing device can be modified based on the parameter data. The design data can be indicative of a layout for the quantum computing device. For example, the design data can include a location for one or more components within the quantum computing device. Additionally or alternatively, the design data can include an electrical parameter for one or more components within the quantum computing device. Additionally or alternatively, the design data can include a value and/or settings for one or more components within the quantum computing device. Additionally or alternatively, the design data can include a size, a shape and/or an arrangement for one or more components within the quantum computing device. In an embodiment, the design data can be generated based on the Hamiltonian data. In certain embodiments, the computer-implemented method 1100 can include re-simulating, by the system, the quantum computing device using the electromagnetic circuit data in response to a determination that the Hamiltonian data satisfies a defined criterion.

Figure 12:
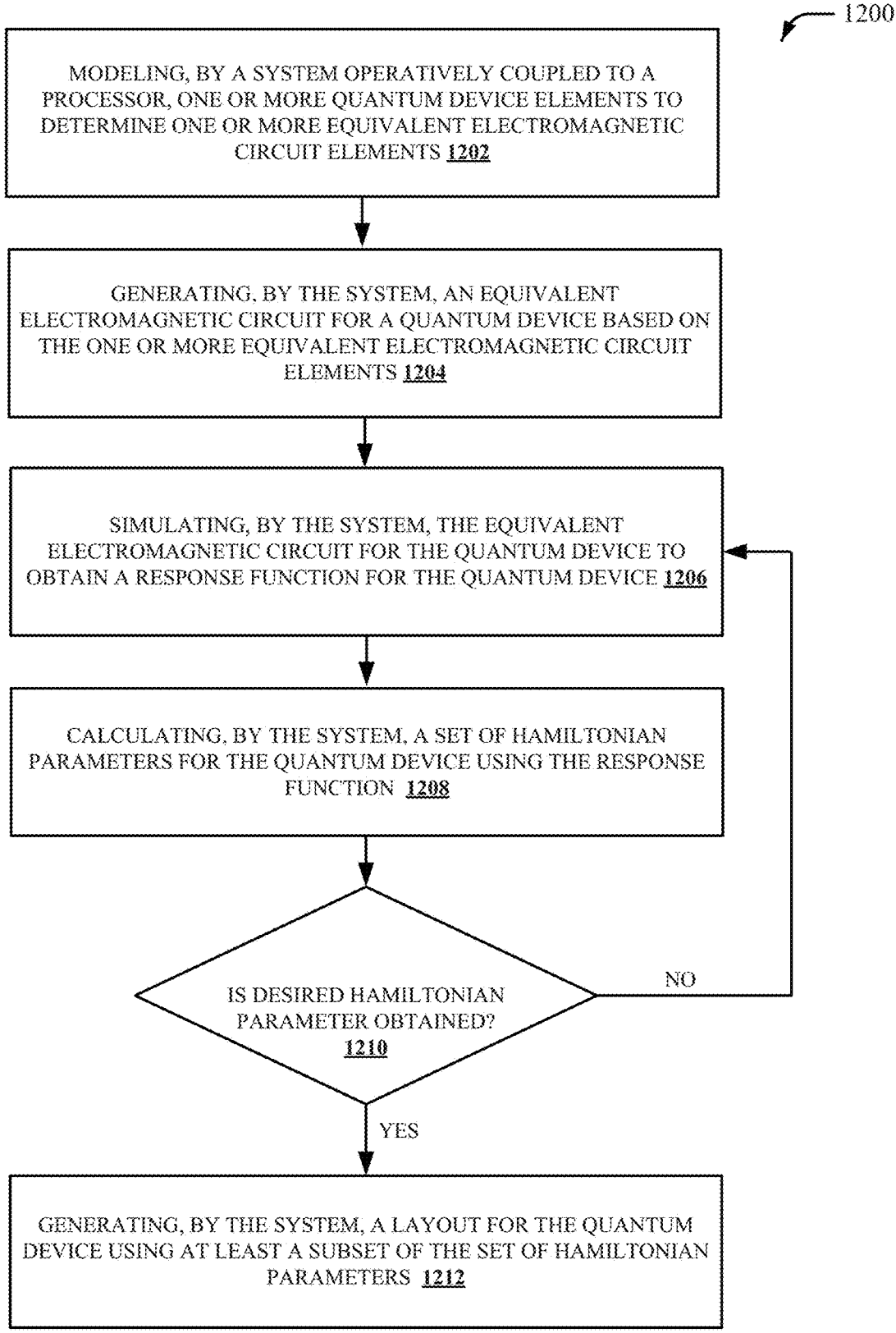
FIG. 12 illustrates a flow diagram of another example, non-limiting computer-implemented method for facilitating quantum computing device design in accordance with one or more embodiments described herein.

FIG. 12 illustrates a flow diagram of an example, non-limiting computer-implemented method 1200 for facilitating quantum computing device design in accordance with one or more embodiments described herein. At 1202, one or more quantum device elements are modeled, by a system operatively coupled to a processor (e.g., by modeling component 104), to determine one or more equivalent electromagnetic circuit elements. At 1204, an equivalent electromagnetic circuit for a quantum device is generated, by the system (e.g., by modeling component 104), based on the one or more equivalent electromagnetic circuit elements. At 1206, the equivalent electromagnetic circuit for the quantum device is simulated, by the system (e.g., by simulation component 106), to obtain a response function for the quantum device. At 1208, a set of Hamiltonian parameters for the quantum device is calculated, by the system (e.g., by simulation component 106), using the response function. At 1210, it is determined whether a desired Hamiltonian parameter is obtained. If no, the computer-implemented method 1200 returns to 1206. If yes, the computer-implemented method 1200 proceeds to 1108. At 1212, a layout for the quantum device is generated, by the system (e.g., by design component 202), using at least a subset of the set of Hamiltonian parameters.

For simplicity of explanation, the computer-implemented methodologies are depicted and described as a series of acts. It is to be understood and appreciated that the subject innovation is not limited by the acts illustrated and/or by the order of acts, for example acts can occur in various orders and/or concurrently, and with other acts not presented and described herein. Furthermore, not all illustrated acts can be required to implement the computer-implemented methodologies in accordance with the disclosed subject matter. In addition, those skilled in the art will understand and appreciate that the computer-implemented methodologies could alternatively be represented as a series of interrelated states via a state diagram or events. Additionally, it should be further appreciated that the computer-implemented methodologies disclosed hereinafter and throughout this specification are capable of being stored on an article of manufacture to facilitate transporting and transferring such computer-implemented methodologies to computers. The term article of manufacture, as used herein, is intended to encompass a computer program accessible from any computer-readable device or storage media.

Moreover, because at least generating design data and/or a layout for a quantum device (e.g., a quantum computing device), simulating an electromagnetic circuit element and/or an equivalent electromagnetic circuit, etc. are established from a combination of electrical and mechanical components and circuitry, a human is unable to replicate or perform processing performed by the quantum computing device design tool 102 (e.g., the modeling component 104, the simulation component 106, and/or the design component 202) disclosed herein. For example, a human is unable to generate design data, simulate an electromagnetic circuit element and/or an equivalent electromagnetic circuit, etc.

Figure 13:
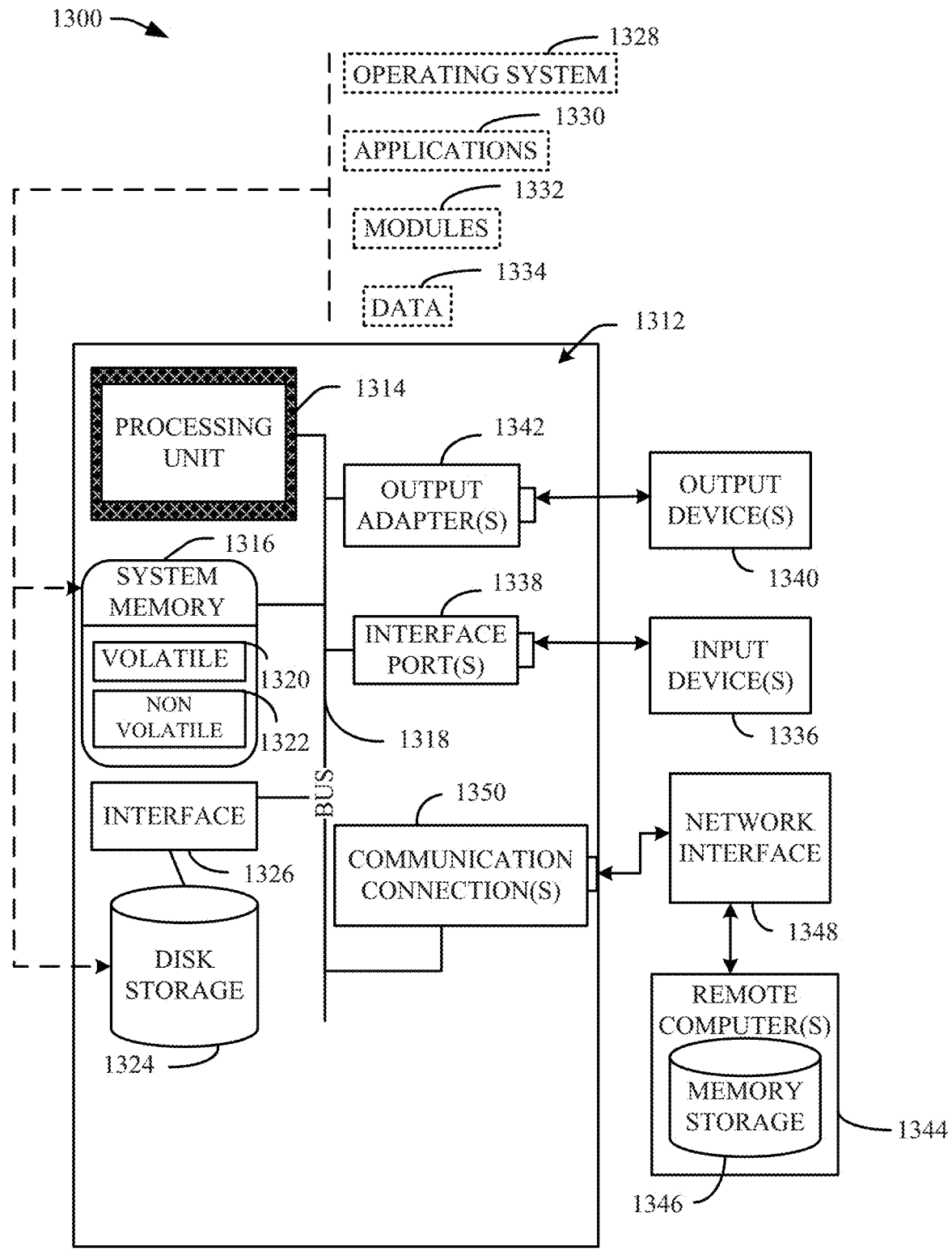
FIG. 13 illustrates a block diagram of an example, non-limiting operating environment in which one or more embodiments described herein can be facilitated.

In order to provide a context for the various aspects of the disclosed subject matter, FIG. 13 as well as the following discussion are intended to provide a general description of a suitable environment in which the various aspects of the disclosed subject matter can be implemented. FIG. 13 illustrates a block diagram of an example, non-limiting operating environment in which one or more embodiments described herein can be facilitated. Repetitive description of like elements employed in other embodiments described herein is omitted for sake of brevity.

With reference to FIG. 13, a suitable operating environment 1300 for implementing various aspects of this disclosure can also include a computer 1312. The computer 1312 can also include a processing unit 1314, a system memory 1316, and a system bus 1318. The system bus 1318 couples system components including, but not limited to, the system memory 1316 to the processing unit 1314. The processing unit 1314 can be any of various available processors. Dual microprocessors and other multiprocessor architectures also can be employed as the processing unit 1314. The system bus 1318 can be any of several types of bus structure(s) including the memory bus or memory controller, a peripheral bus or external bus, and/or a local bus using any variety of available bus architectures including, but not limited to, Industrial Standard Architecture (ISA), Micro-Channel Architecture (MSA), Extended ISA (EISA), Intelligent Drive Electronics (IDE), VESA Local Bus (VLB), Peripheral Component Interconnect (PCI), Card Bus, Universal Serial Bus (USB), Advanced Graphics Port (AGP), Firewire (IEEE 1394), and Small Computer Systems Interface (SCSI).

The system memory 1316 can also include volatile memory 1320 and nonvolatile memory 1322. The basic input/output system (BIOS), containing the basic routines to transfer information between elements within the computer 1312, such as during start-up, is stored in nonvolatile memory 1322. Computer 1312 can also include removable/non-removable, volatile/non-volatile computer storage media. FIG. 13 illustrates, for example, a disk storage 1324. Disk storage 1324 can also include, but is not limited to, devices like a magnetic disk drive, floppy disk drive, tape drive, Jaz drive, Zip drive, LS-100 drive, flash memory card, or memory stick. The disk storage 1324 also can include storage media separately or in combination with other storage media. To facilitate connection of the disk storage 1324 to the system bus 1318, a removable or non-removable interface is typically used, such as interface 1326. FIG. 13 also depicts software that acts as an intermediary between users and the basic computer resources described in the suitable operating environment 1300. Such software can also include, for example, an operating system 1328. Operating system 1328, which can be stored on disk storage 1324, acts to control and allocate resources of the computer 1312.

System applications 1330 take advantage of the management of resources by operating system 1328 through program modules 1332 and program data 1334, e.g., stored either in system memory 1316 or on disk storage 1324. It is to be appreciated that this disclosure can be implemented with various operating systems or combinations of operating systems. A user enters commands or information into the computer 1312 through input device(s) 1336. Input devices 1336 include, but are not limited to, a pointing device such as a mouse, trackball, stylus, touch pad, keyboard, microphone, joystick, game pad, satellite dish, scanner, TV tuner card, digital camera, digital video camera, web camera, and the like. These and other input devices connect to the processing unit 1314 through the system bus 1318 via interface port(s) 1338. Interface port(s) 1338 include, for example, a serial port, a parallel port, a game port, and a universal serial bus (USB). Output device(s) 1340 use some of the same type of ports as input device(s) 1336. Thus, for example, a USB port can be used to provide input to computer 1312, and to output information from computer 1312 to an output device 1340. Output adapter 1342 is provided to illustrate that there are some output devices 1340 like monitors, speakers, and printers, among other output devices 1340, which require special adapters. The output adapters 1342 include, by way of illustration and not limitation, video and sound cards that provide a means of connection between the output device 1340 and the system bus 1318. It should be noted that other devices and/or systems of devices provide both input and output capabilities such as remote computer(s) 1344.

Computer 1312 can operate in a networked environment using logical connections to one or more remote computers, such as remote computer(s) 1344. The remote computer(s) 1344 can be a computer, a server, a router, a network PC, a workstation, a microprocessor based appliance, a peer device or other common network node and the like, and typically can also include many or all of the elements described relative to computer 1312. For purposes of brevity, only a memory storage device 1346 is illustrated with remote computer(s) 1344. Remote computer(s) 1344 is logically connected to computer 1312 through a network interface 1348 and then physically connected via communication connection 1350. Network interface 1348 encompasses wire and/or wireless communication networks such as local-area networks (LAN), wide-area networks (WAN), cellular networks, etc. LAN technologies include Fiber Distributed Data Interface (FDDI), Copper Distributed Data Interface (CDDI), Ethernet, Token Ring and the like. WAN technologies include, but are not limited to, point-to-point links, circuit switching networks like Integrated Services Digital Networks (ISDN) and variations thereon, packet switching networks, and Digital Subscriber Lines (DSL). Communication connection(s) 1350 refers to the hardware/software employed to connect the network interface 1348 to the system bus 1318. While communication connection 1350 is shown for illustrative clarity inside computer 1312, it can also be external to computer 1312. The hardware/software for connection to the network interface 1348 can also include, for exemplary purposes only, internal and external technologies such as, modems including regular telephone grade modems, cable modems and DSL modems, ISDN adapters, and Ethernet cards.

The present invention may be a system, a method, an apparatus and/or a computer program product at any possible technical detail level of integration. The computer program product can include a computer readable storage medium (or media) having computer readable program instructions thereon for causing a processor to carry out aspects of the present invention. The computer readable storage medium can be a tangible device that can retain and store instructions for use by an instruction execution device. The computer readable storage medium can be, for example, but is not limited to, an electronic storage device, a magnetic storage device, an optical storage device, an electromagnetic storage device, a semiconductor storage device, or any suitable combination of the foregoing. A non-exhaustive list of more specific examples of the computer readable storage medium can also include the following: a portable computer diskette, a hard disk, a random access memory (RAM), a read-only memory (ROM), an erasable programmable read-only memory (EPROM or Flash memory), a static random access memory (SRAM), a portable compact disc read-only memory (CD-ROM), a digital versatile disk (DVD), a memory stick, a floppy disk, a mechanically encoded device such as punch-cards or raised structures in a groove having instructions recorded thereon, and any suitable combination of the foregoing. A computer readable storage medium, as used herein, is not to be construed as being transitory signals per se, such as radio waves or other freely propagating electromagnetic waves, electromagnetic waves propagating through a waveguide or other transmission media (e.g., light pulses passing through a fiber-optic cable), or electrical signals transmitted through a wire.

Computer readable program instructions described herein can be downloaded to respective computing/processing devices from a computer readable storage medium or to an external computer or external storage device via a network, for example, the Internet, a local area network, a wide area network and/or a wireless network. The network can comprise copper transmission cables, optical transmission fibers, wireless transmission, routers, firewalls, switches, gateway computers and/or edge servers. A network adapter card or network interface in each computing/processing device receives computer readable program instructions from the network and forwards the computer readable program instructions for storage in a computer readable storage medium within the respective computing/processing device. Computer readable program instructions for carrying out operations of the present invention can be assembler instructions, instruction-set-architecture (ISA) instructions, machine instructions, machine dependent instructions, microcode, firmware instructions, state-setting data, configuration data for integrated circuitry, or either source code or object code written in any combination of one or more programming languages, including an object oriented programming language such as Smalltalk, C++, or the like, and procedural programming languages, such as the "C" programming language or similar programming languages. The computer readable program instructions can execute entirely on the user's computer, partly on the user's computer, as a stand-alone software package, partly on the user's computer and partly on a remote computer or entirely on the remote computer or server. In the latter scenario, the remote computer can be connected to the user's computer through any type of network, including a local area network (LAN) or a wide area network (WAN), or the connection can be made to an external computer (for example, through the Internet using an Internet Service Provider). In some embodiments, electronic circuitry including, for example, programmable logic circuitry, field-programmable gate arrays (FPGA), or programmable logic arrays (PLA) can execute the computer readable program instructions by utilizing state information of the computer readable program instructions to personalize the electronic circuitry, in order to perform aspects of the present invention.

Aspects of the present invention are described herein with reference to flowchart illustrations and/or block diagrams of methods, apparatus (systems), and computer program products according to embodiments of the invention. It will be understood that each block of the flowchart illustrations and/or block diagrams, and combinations of blocks in the flowchart illustrations and/or block diagrams, can be implemented by computer readable program instructions. These computer readable program instructions can be provided to a processor of a general purpose computer, special purpose computer, or other programmable data processing apparatus to produce a machine, such that the instructions, which execute via the processor of the computer or other programmable data processing apparatus, create means for implementing the functions/acts specified in the flowchart and/or block diagram block or blocks. These computer readable program instructions can also be stored in a computer readable storage medium that can direct a computer, a programmable data processing apparatus, and/or other devices to function in a particular manner, such that the computer readable storage medium having instructions stored therein comprises an article of manufacture including instructions which implement aspects of the function/act specified in the flowchart and/or block diagram block or blocks. The computer readable program instructions can also be loaded onto a computer, other programmable data processing apparatus, or other device to cause a series of operational acts to be performed on the computer, other programmable apparatus or other device to produce a computer implemented process, such that the instructions which execute on the computer, other programmable apparatus, or other device implement the functions/acts specified in the flowchart and/or block diagram block or blocks.

The flowchart and block diagrams in the Figures illustrate the architecture, functionality, and operation of possible implementations of systems, methods, and computer program products according to various embodiments of the present invention. In this regard, each block in the flowchart or block diagrams can represent a module, segment, or portion of instructions, which comprises one or more executable instructions for implementing the specified logical function(s). In some alternative implementations, the functions noted in the blocks can occur out of the order noted in the Figures. For example, two blocks shown in succession can, in fact, be executed substantially concurrently, or the blocks can sometimes be executed in the reverse order, depending upon the functionality involved. It will also be noted that each block of the block diagrams and/or flowchart illustration, and combinations of blocks in the block diagrams and/or flowchart illustration, can be implemented by special purpose hardware-based systems that perform the specified functions or acts or carry out combinations of special purpose hardware and computer instructions.

While the subject matter has been described above in the general context of computer-executable instructions of a computer program product that runs on a computer and/or computers, those skilled in the art will recognize that this disclosure also can or can be implemented in combination with other program modules. Generally, program modules include routines, programs, components, data structures, etc. that perform particular tasks and/or implement particular abstract data types. Moreover, those skilled in the art will appreciate that the inventive computer-implemented methods can be practiced with other computer system configurations, including single-processor or multiprocessor computer systems, mini-computing devices, mainframe computers, as well as computers, hand-held computing devices (e.g., PDA, phone), microprocessor-based or programmable consumer or industrial electronics, and the like. The illustrated aspects can also be practiced in distributed computing environments in which tasks are performed by remote processing devices that are linked through a communications network. However, some, if not all aspects of this disclosure can be practiced on stand-alone computers. In a distributed computing environment, program modules can be located in both local and remote memory storage devices.

As used in this application, the terms "component," "system," "platform," "interface," and the like, can refer to and/or can include a computer-related entity or an entity related to an operational machine with one or more specific functionalities. The entities disclosed herein can be either hardware, a combination of hardware and software, software, or software in execution. For example, a component can be, but is not limited to being, a process running on a processor, a processor, an object, an executable, a thread of execution, a program, and/or a computer. By way of illustration, both an application running on a server and the server can be a component. One or more components can reside within a process and/or thread of execution and a component can be localized on one computer and/or distributed between two or more computers. In another example, respective components can execute from various computer readable media having various data structures stored thereon. The components can communicate via local and/or remote processes such as in accordance with a signal having one or more data packets (e.g., data from one component interacting with another component in a local system, distributed system, and/or across a network such as the Internet with other systems via the signal). As another example, a component can be an apparatus with specific functionality provided by mechanical parts operated by electric or electronic circuitry, which is operated by a software or firmware application executed by a processor. In such a case, the processor can be internal or external to the apparatus and can execute at least a part of the software or firmware application. As yet another example, a component can be an apparatus that provides specific functionality through electronic components without mechanical parts, wherein the electronic components can include a processor or other means to execute software or firmware that confers at least in part the functionality of the electronic components. In an aspect, a component can emulate an electronic component via a virtual machine, e.g., within a cloud computing system.

In addition, the term "or" is intended to mean an inclusive "or" rather than an exclusive "or." That is, unless specified otherwise, or clear from context, "X employs A or B" is intended to mean any of the natural inclusive permutations. That is, if X employs A; X employs B; or X employs both A and B, then "X employs A or B" is satisfied under any of the foregoing instances. Moreover, articles "a" and "an" as used in the subject specification and annexed drawings should generally be construed to mean "one or more" unless specified otherwise or clear from context to be directed to a singular form. As used herein, the terms "example" and/or "exemplary" are utilized to mean serving as an example, instance, or illustration. For the avoidance of doubt, the subject matter disclosed herein is not limited by such examples. In addition, any aspect or design described herein as an "example" and/or "exemplary" is not necessarily to be construed as preferred or advantageous over other aspects or designs, nor is it meant to preclude equivalent exemplary structures and techniques known to those of ordinary skill in the art.

As it is employed in the subject specification, the term "processor" can refer to substantially any computing processing unit or device comprising, but not limited to, single-core processors; single-processors with software multithread execution capability; multi-core processors; multi-core processors with software multithread execution capability; multi-core processors with hardware multithread technology; parallel platforms; and parallel platforms with distributed shared memory. Additionally, a processor can refer to an integrated circuit, an application specific integrated circuit (ASIC), a digital signal processor (DSP), a field programmable gate array (FPGA), a programmable logic controller (PLC), a complex programmable logic device (CPLD), a discrete gate or transistor logic, discrete hardware components, or any combination thereof designed to perform the functions described herein. Further, processors can exploit nano-scale architectures such as, but not limited to, molecular and quantum-dot based transistors, switches and gates, in order to optimize space usage or enhance performance of user equipment. A processor can also be implemented as a combination of computing processing units. In this disclosure, terms such as "store," "storage," "data store," data storage," "database," and substantially any other information storage component relevant to operation and functionality of a component are utilized to refer to "memory components," entities embodied in a "memory," or components comprising a memory. It is to be appreciated that memory and/or memory components described herein can be either volatile memory or nonvolatile memory, or can include both volatile and nonvolatile memory. By way of illustration, and not limitation, nonvolatile memory can include read only memory (ROM), programmable ROM (PROM), electrically programmable ROM (EPROM), electrically erasable ROM (EEPROM), flash memory, or nonvolatile random access memory (RAM) (e.g., ferroelectric RAM (FeRAM). Volatile memory can include RAM, which can act as external cache memory, for example. By way of illustration and not limitation, RAM is available in many forms such as synchronous RAM (SRAM), dynamic RAM (DRAM), synchronous DRAM (SDRAM), double data rate SDRAM (DDR SDRAM), enhanced SDRAM (ESDRAM), Synchlink DRAM (SLDRAM), direct Rambus RAM (DRRAM), direct Rambus dynamic RAM (DRDRAM), and Rambus dynamic RAM (RDRAM). Additionally, the disclosed memory components of systems or computer-implemented methods herein are intended to include, without being limited to including, these and any other suitable types of memory.

What has been described above include mere examples of systems and computer-implemented methods. It is, of course, not possible to describe every conceivable combination of components or computer-implemented methods for purposes of describing this disclosure, but one of ordinary skill in the art can recognize that many further combinations and permutations of this disclosure are possible. Furthermore, to the extent that the terms "includes," "has," "possesses," and the like are used in the detailed description, claims, appendices and drawings such terms are intended to be inclusive in a manner similar to the term "comprising" as "comprising" is interpreted when employed as a transitional word in a claim.

The descriptions of the various embodiments have been presented for purposes of illustration, but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments disclosed herein.

What is claimed is:

1. A system of a quantum computing device design tool, comprising:
   a memory that stores computer executable components;
   a processor that executes the computer executable components stored in the memory, wherein the computer executable components comprise:
   a modeling component that models a quantum device element of a quantum computing device as an equivalent electromagnetic circuit element to generate electromagnetic circuit data for the quantum computing device, wherein the quantum device element comprises a qubit element;
   a simulation component that simulates the quantum computing device using the electromagnetic circuit data to generate response function data indicative of a response function for the quantum computing device; and a design component modifies a layout of one or more elements of the quantum computing device based on the response function data.

2. The system of claim 1, wherein the quantum device element is a first quantum device element of the quantum computing device, and wherein the modeling component generates connection data indicative of information associated with a connection between the first quantum device element and a second quantum device element of the quantum computing device.

3. The system of claim 2, wherein the modeling component generates the electromagnetic circuit data for the quantum computing device based on the connection data.

4. The system of claim 1, wherein the simulation component generates Hamiltonian data based on the response function data.

5. The system of claim 4, wherein the simulation component re-simulates the quantum computing device using the electromagnetic circuit data in response to a determination that the Hamiltonian data satisfies a defined criterion.

6. The system of claim 4, wherein the design component modifies the layout of the one or more elements of the quantum computing device further based on the Hamiltonian data.

7. The system of claim 1, wherein the modeling component models the quantum device element of the quantum computing device as the equivalent electromagnetic circuit element based on a library of electromagnetic circuit elements.

8. The system of claim 1, wherein the response function data generated by the simulation component facilitates improved quality of the quantum computing device.

9. A computer-implemented method, comprising:
modeling, by a system operatively coupled to a processor, a quantum device element of a quantum computing device as an equivalent electromagnetic circuit element to generate electromagnetic circuit data for the quantum computing device, wherein the quantum device element comprises a qubit element;
simulating, by the system, the quantum computing device, using the electromagnetic circuit data to generate parameter data indicative of a set of parameters for the quantum computing device; and
modifying, by the system, a layout of one or more elements of the quantum computing device based on the parameter data.

10. The computer-implemented method of claim 9, wherein the simulating the quantum computing device comprises simulating the quantum computing device using the electromagnetic circuit data to generate response function data indicative of a response function for the quantum computing device.

11. The computer-implemented method of claim 10, wherein the simulating the quantum computing device comprises generating Hamiltonian data based on the response function data.

12. The computer-implemented method of claim 11, wherein the modifying the layout is further based on the Hamiltonian data.

13. The computer-implemented method of claim 11, further comprising:
re-simulating, by the system, the quantum computing device using the electromagnetic circuit data in response to a determination that the Hamiltonian data satisfies a defined criterion.

14. The computer-implemented method of claim 9, further comprising:
generating, by the system, connection data indicative of information associated with one or more connections between quantum device elements of the quantum computing device.

15. The computer-implemented method of claim 14, wherein the modeling the quantum device element comprises generating the electromagnetic circuit data for the quantum computing device based on the connection data.

16. The computer-implemented method of claim 9, wherein the modeling the quantum device element comprises modeling the quantum device element of the quantum computing device as the equivalent electromagnetic circuit element based on a library of electromagnetic circuit elements.

17. The computer-implemented method of claim 9, wherein the generating the design data comprises improving the quantum computing device.

18. A computer program product for quantum computing device design, the computer program product comprising a computer readable storage medium having program instructions embodied therewith, the program instructions executable by a processor to cause the processor to:
model, by the processor, one or more quantum device elements of a quantum computing device as one or more electromagnetic circuit elements, wherein the one or more quantum device elements comprise a qubit element;
generate, by the processor, an equivalent electromagnetic circuit for the quantum computing device based on the one or more electromagnetic circuit elements;
simulate, by the processor, the equivalent electromagnetic circuit to generate parameter data indicative of a set of parameters for the quantum computing device; and
modify, by the processor, a layout of the one or more quantum device elements of the quantum computing device based on the parameter data.

19. The computer program product of claim 18, wherein the program instructions are further executable by the processor to cause the processor to:
simulate, by the processor, the equivalent electromagnetic circuit to generate response function data indicative of a response function for the quantum computing device.

20. The computer program product of claim 19, wherein the program instructions are further executable by the processor to cause the processor to:
generate, by the processor, Hamiltonian data based on the response function data, wherein the Hamiltonian data is indicative of information associated with energy of the quantum computing device.

21. A system of a quantum computing device design tool, comprising:
a memory that stores computer executable components;
a processor that executes the computer executable components stored in the memory, wherein the computer executable components comprise:
a modeling component that models a quantum device element of a quantum computing device as an equivalent electromagnetic circuit element to generate electromagnetic circuit data for the quantum computing device, wherein the quantum device element comprises a qubit element;
a simulation component that simulates the quantum computing device using the electromagnetic circuit data to generate response function data indicative of a response function for the quantum computing device, and generates Hamiltonian data based on the response function data, wherein the Hamiltonian data is indicative of information associated with energy of the quantum computing device; and a design component that generates design data indicative of a modification of a layout of one or more elements of the quantum computing device based on the Hamiltonian data.

22. The system of claim 21, wherein the quantum device element is a first quantum device element of the quantum computing device, and wherein the modeling component generates connection data indicative of information associated with a connection between the first quantum device element and a second quantum device element of the quantum computing device.

23. The system of claim 22, wherein the modeling component generates the electromagnetic circuit data for the quantum computing device based on the connection data.

24. A computer-implemented method, comprising:

modeling, by a system operatively coupled to a processor, one or more quantum device elements of a quantum computing device as one or more electromagnetic circuit elements, wherein the one or more quantum device elements comprise a qubit element;

generating, by the system, an equivalent electromagnetic circuit for the quantum computing device based on the one or more electromagnetic circuit elements;

simulating, by the system, the equivalent electromagnetic circuit to generate response function data indicative of a response function for the quantum computing device;

generating, by the system, a set of Hamiltonian parameters for the quantum computing device using the response function; and generating, by the system, a modification of a layout of one or more elements of the quantum computing device based on the set of Hamiltonian parameters.

25. The computer-implemented method of claim 24, further comprising:

re-simulating, by the system, the equivalent electromagnetic circuit in response to a determination that a Hamiltonian parameter from the set of Hamiltonian parameters satisfies a defined criterion.

* * * * *